United States Patent [19]
Morohashi et al.

[11] Patent Number: 5,338,934
[45] Date of Patent: Aug. 16, 1994

[54] RADIATION DETECTING DEVICE AND METHOD FOR FABRICATING THE SAME

[75] Inventors: Shinichi Morohashi; Satoshi Komiya, both of Kawasaki, Japan

[73] Assignee: Fujitsu Limited, Kawasaki, Japan

[21] Appl. No.: 92,614

[22] Filed: Jul. 16, 1993

[30] Foreign Application Priority Data

Jul. 17, 1992 [JP] Japan .................. 4-199126
Oct. 19, 1992 [JP] Japan .................. 4-280002

[51] Int. Cl.⁵ .............................. H01L 31/00
[52] U.S. Cl. .............................. 250/336.2
[58] Field of Search ............ 250/336.2, 336.1, 370.12

[56] References Cited

PUBLICATIONS

Le Grand et al, "Superconductive Junctions for x-ray Spect." Low Temp. Detect. Neutrinos ... IV, Proc. Int. Workshop (Meeting Date 1991) pp. 265-273. Ed. Booth et al.

Twerenbold et al, "Superconducting Sn/Sn-oxide/Sn tunneling junctions as high-resol. x-ray detect." J. Appl. Phys 61(1) Jan. 1987.

Primary Examiner—Paul M. Dzierzynski
Assistant Examiner—Richard Hanig
Attorney, Agent, or Firm—Staas & Halsey

[57] ABSTRACT

A radiation detecting device comprises a substrate, a first superconductor layer formed on the substrate, a barrier layer formed on the first superconductor layer, and a second superconductor layer formed on the barrier layer, a junction formed of the first superconductor layer, the barrier layer and the second superconductor layer receiving radiation for detection thereof, the first superconductor layer being a Ta layer, the barrier layer including a TaOx layer, an AlOx layer, a HfOx layer or a ZrOx layer, and the second superconductor layer being a Ta layer. A underlayer of Nb, V, W, Hf, Zr or Ti having a lattice constant approximate to that of Ta is formed directly below the first superconductor layer. A underlayer of V, W or Ti having a lattice constant approximate to that of Ta is formed directly below the second superconductor layer. An opening is formed in the substrate and the radiation stopping layer directly below the junction, radiation being incident to the junction through the opening.

32 Claims, 25 Drawing Sheets

FIG. 1

|     | Tc (K) | $\frac{2\Delta_0}{K_B T_c}$ | $\theta_D$ (K) | $\tau_0$ ($10^{-9}$s) | $\tau_0^{ph}$ ($10^{-10}$s) |
|-----|--------|---------|-----|--------|--------|
| Pb  | 7.19   | 4.3     | 105 | 0.196  | 0.340  |
| In  | 3.40   | 3.6     | 108 | 0.799  | 1.69   |
| Sn  | 3.75   | 3.5     | 200 | 2.300  | 1.10   |
| Hg  | 4.19   | 4.6     | 72  | 0.0747 | 1.35   |
| Ta  | 4.48   | 3.6     | 240 | 1.78   | 0.227  |
| Nb  | 9.20   | 3.8     | 275 | 0.149  | 0.0417 |
| Al  | 1.19   | 3.3     | 428 | 438    | 2.42   |

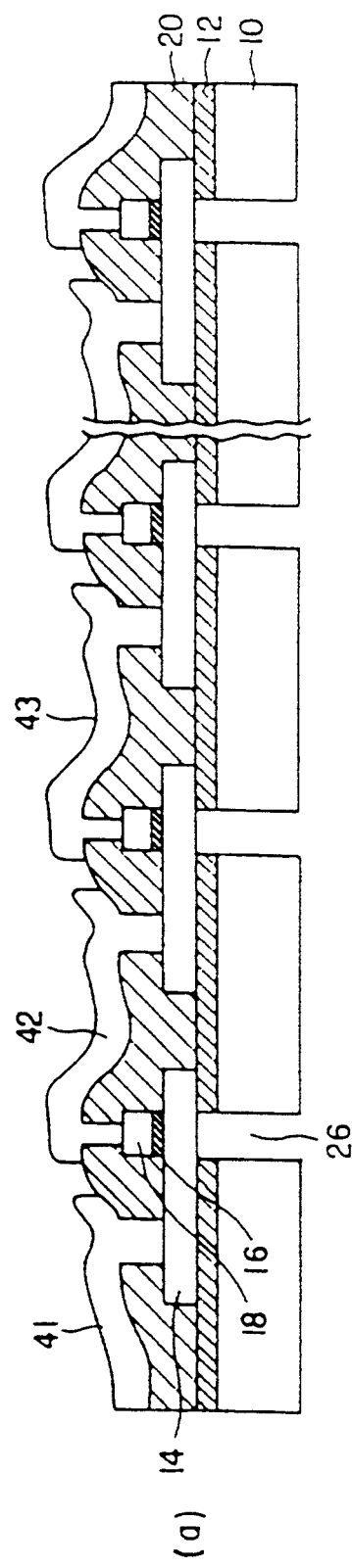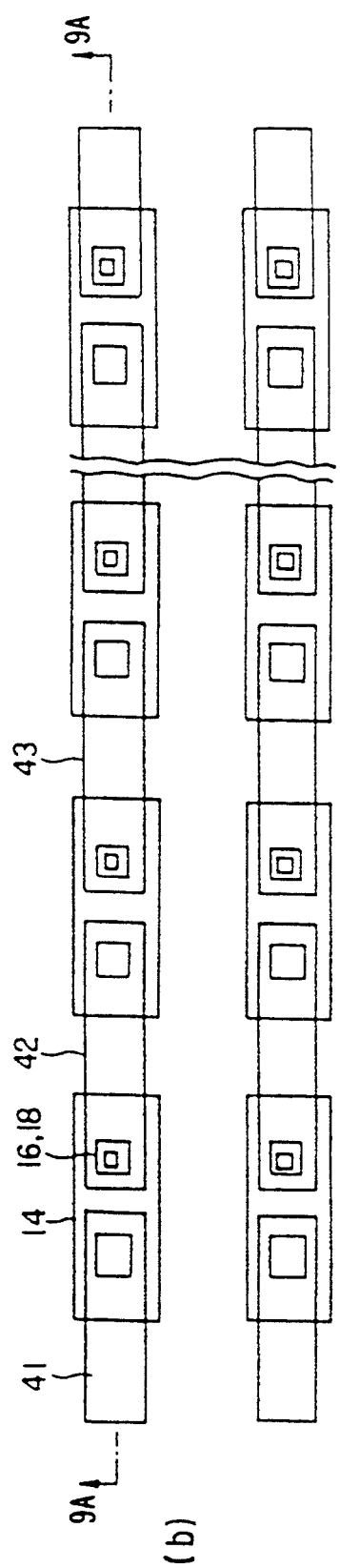

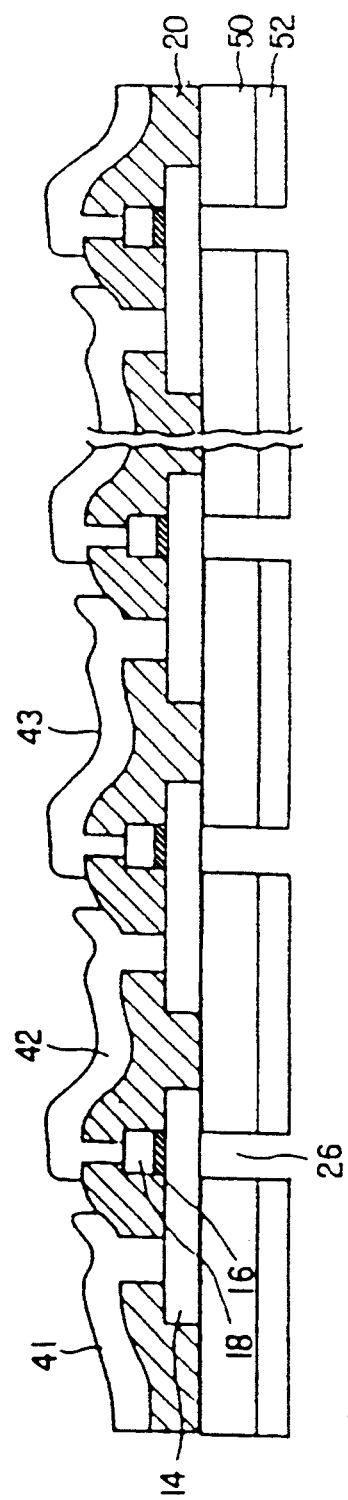
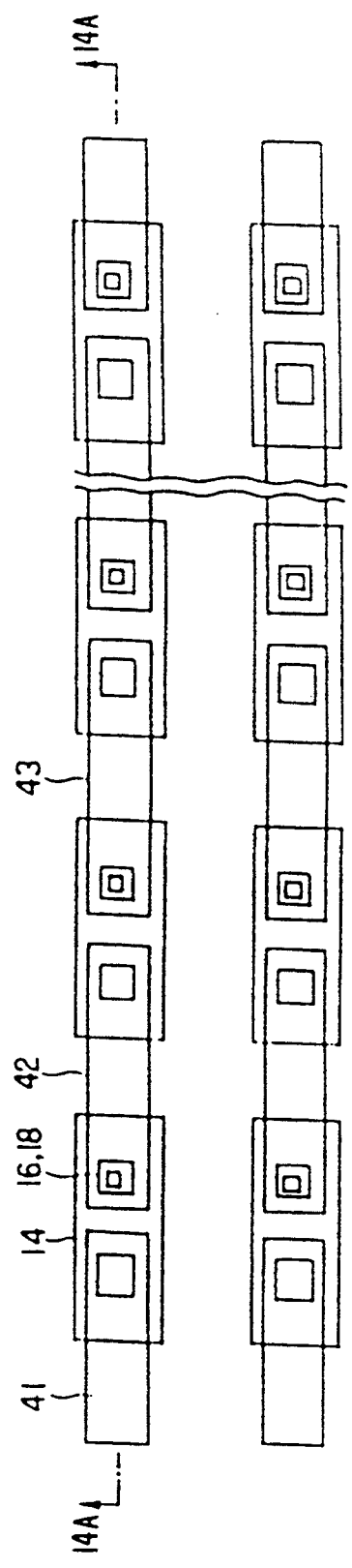
FIG. 14A
FIG. 14B

■ : QUASIPARTICLES

⬭ : COOPER PAIR

RADIATION DETECTING DEVICE AND METHOD FOR FABRICATING THE SAME

BACKGROUND OF THE INVENTION

The present invention relates to a radiation detecting device for detecting X rays, γ rays, etc., and a method for fabricating the same.

The most typical one of the techniques using radiation, such as X rays, γ rays, etc. uses synchrotron radiation. The synchrotron radiation is electromagnetic waves of very strong directivity emitted when electrons which are emitted from a synchrotron and moving at velocities approximate to the light velocity are deflected from their orbits by a magnetic field. Synchrotron radiation is so superior in wavelength continuation, deflectivity, pulsation, etc. that its applications in a very wide variety of fields, such as crystal structure analyses, surface structure analyses, interface structure analyses, property studies, imaging techniques, industrial applications, biological applications, medical applications, etc. are expected.

Not only synchrotron radiation, but also other radiation, such as common X rays, etc., are widely used in medical cares and property analyses.

The radiation detecting devices used in these fields have detecting units of various structure and detecting characteristics, etc. in accordance with their applications. A factor of the radiation detecting devices which is important commonly in all these fields is good energy resolving powers.

As radiation detecting devices of high energy resolving powers are known are semiconductor radiation detecting devices using semiconductors, such as Si, Ge and others. These energy resolving powers have almost reached to limits defined by statistical fluctuations of electron-hole pair numbers created therein by the applied radiation.

In some of the above-described application fields, radiation detecting devices of higher energy resolving powers than theoretical limit energy resolving powers of semiconductor radiation detecting devices are earnestly expected. To this end, radiation detecting devices whose limit energy resolving powers due to statistical fluctuations are low are demanded. What is noted under such circumstances is radiation detecting devices using superconductors.

When radiation of energy E is incident on a radiation detecting device, a number of electron-hole pairs are created and are collected as detection signals. A relative energy resolving power P caused by fluctuations of a number N of created electron-hole pairs is given by the following formula:

$$P = 2.355 \, (\epsilon \times F \times E)^{\frac{1}{2}}$$

where $\epsilon$ is energy necessary to create one electron-hole pair by radiation; and F is called Fano factor and defined by $<(N-<N>)^2>/<N>$, and F is a parameter for a degree of fluctuations of a number of the excited electrons being smaller than a Poisson's distribution, and F=1 when they agree with a Poisson's distribution and F<1 when they do not agree with a Poisson's distribution ("Energy Dispersiton type X-ray Analysis" edit by Yohichi Gohshi and Kimitaka Satoh, Nippopn Bunkoh Gakkai Measuirng Method Series, Gakkai Shuppan Center).

This formula shows that it is an important factor to improve an energy resolving power of a radiation detecting device that a material which is able to create a larger number of electron-hole pairs by incident radiation, i.e., a material which has a small energy $\epsilon$, is available.

It can be said that electron-hole pairs can be created with a small energy $\epsilon$ when a material of a radiation detecting device has a narrow energy gap Eg. But, when a semiconductor material is used, an energy $\mu$ is expressed by $$\epsilon = 2.8 \times Eg + (0.5 \sim 1.0) \, [eV].$$

Thus it is known that a small energy gap Eg does not always result in a proportionally small energy $\epsilon$ value (C. A. Klein, J. Appl. Phys., vol. 39, p. 2090, (1968)).

That is, this formula shows that however small an energy gap Eg may be, an energy $\epsilon$ is never below $0.5 \sim 1.0$ eV, i.e., that a number of created electron-hole pairs is limited. Thus in radiation detecting devices of semiconductor materials, phonons (with a maximum energy of tens meV) emitted when electron-hole pairs are generated can not excite electron-hole pairs.

But in radiation detecting devices of superconductors, because of small energy gaps Eg (about some meV), phonons (with a maximum energy of tens meV) when electron-hole pairs are broken break electron pairs to generate quasiparticles, i.e., increase a number of quasiparticle N, and it is possible to fabricate radiation detecting devices of high energy resolving powers.

A Monte Carlo simulation was conducted by a computer on, in a radiation detecting device using a superconductor material, a process of quasiparticle and phonon excitation of a cascade excitation of direct electron excitation of radiation, emission of phonons by quasiparticles, and creation of quasiparticles by the phonons, and the result was that a number of quasiparticles which is larger by three figures than that in semiconductor radiation detecting devices, and energy $\epsilon = 0.969$ meV, and a parameter $F = 0.2$ were theoretically given (M. Kurakado and H. Mazaki, Phys. Rev. B22 (1980) 168).

In experiments on Sn/SnOx/Sn junctions which will be explained later, energy $\epsilon = 2.4$ meV (M. Kurakado, Nucl. Nuc. Instrum and Method, vol 186, p 275 (1982). FIG. 23 shows relationships between energy resolving powers and incident energy with a Fano factor F and energy $\epsilon$ given by theoretical values for Case 1, and with energy $\epsilon$ given by an experimental value and F=1. In FIG. 23, a relationship between energy resolving powers and incident energy for a case in which Si, which has the highest energy resolving power among the semiconductor materials, ($\epsilon = 3.76$ eV, F=0.08 (experimental values)) is shown for comparison.

As shown in FIG. 23, it is possible that the use of a superconductor materials can fabricate radiation detecting devices having energy resolving powers higher by about 10 times than those of radiation detecting devices using semiconductor materials.

The tunneling process of a Josephson junction comprising a superconductor 1/a barrier/a superconductor 2 occurring when radiation is applied thereto will be explained with reference to FIG. 24. FIG. 24 shows a state in which with a voltage applied to the Josephson junction, the superconductor 1 on one side has a higher energy band by eU.

By the incidence of radiation on the superconductor 1 on one side, electron pairs are broken to create quasiparticles. The creation of the quasiparticles is due to direct excitation of the radiation or excitation by phonons. The qausiparticles reach the superconductor 2 through a tunnel of the barrier.

Improvement of the energy resolving power depends on efficiency of the created quasiparticles tunneling the insulator. This tunneling phenomenon is a non-equivalent state, and efficiency of the tunneling is determined firstly by a relationship between a tunneling time of the quasiparticles, and a recombining time of the quasiparticles accompanied by creation of phonons. The tunneling time and recombining time of the quasiparticles greatly vary depending on kinds of the superconductors. Secondly the efficiency is determined by making the thermally excited quasiparticles less influential, and it will be necessary to measure the radiation at lower temperatures (<4.2K).

The tunneling process of the quasiparticle in the Josephson junction exhibits the current-voltage characteristic of FIG. 25. That is, when a voltage Vo is smaller than a value $2\Delta/e$ corresponding to a bandgap energy $2\Delta$, only quasiparticles above an energy band, and their holes contribute to the current.

In a constant-voltage type in which a constant-voltage Vo is applied to the Josephson junction, a current variation $\Delta I$ is generated before and after incidence of radiation, and the current variation $\Delta I$ is taken out as a signal. In a constant-current type in which a constant-current Io is applied to the Josephson junction, a voltage variation $\Delta V$ is generated before and after incidence of radiation, and the voltage variation $\Delta V$ is taken out as a signal. These current variation $\Delta I$ and voltage variation $\Delta V$ are proportional to incident energy of the radiation.

Radiation detecting devices using such superconductor materials have potential performances surpassing radiation detecting devices using semiconductor materials and are found very prospective.

Conventional radiation detecting devices using superconductors will be explained.

An experiment for applying radiation to a Josephson junction was conducted about 20 years ago (C. H. Wood and B. L. White, Appl. Phys. Lett., vol. 15 (1969), p. 237). The junction comprises Sn/SnOx/Sn. In this experiment signals generated by application of $\alpha$ radiation at most could be identified.

This experiment was followed by a string of experiments using the same Sn/SnOx/Sn junction (M. Kurakado, S. Tachi, R. Katano and H. Mazaki, Bull. Inst. Chem. Res., 59 (Kyoto Univ. 1981) etc.). These experiments found that signals generated by radiation application are not attributed simply to temperature rises, but creation of surplus quasiparticles by the radiation application is the substance of generation of signals by the Josephson junction.

These experiments have been followed by studies and developments of superconductor radiation detectors all over the world in connection with problems of astrophysical problems and elementary particle physical problems, such as determination of masses of neutrinos, measurement of energy distributions of solar neutrinos, and detection of dark substances and magnetic monopoles.

In 1986 Kraus et al. (H. Kraus et al., Europhys. Lett., 1 (1986) 161) and Twerenbold (D. Twerenbold, Europhys, Lett., 1 (1986) 209) independently succeeded in detection of MnK$\alpha$ and MnK$\beta$ from $^{55}$Fe by X rays. The Josephson junction materials were Sn/SnOx/Sn, and the measuring temperature was 0.3K for the preclusion of thermal influences. According to Twerenbold et al.'s experiment, an energy resolving power was a 90 eV half-width for 5.9 KeV X-rays application, and the energy resolving power was a 90 eV half-width excluding the influence of the energy diffusion to the wiring, and was a 41 eV half-width excluding a width due to noises.

Later, by reducing the wire width down to 4 $\mu$m were obtained an energy resolving power of a 48 eV half-width for the application of 5.9 KeV radiation, and an energy resolving power of a 37 eV half-width excluding a width due to noises (W. Rothmund and A. Zohnder, Superconductive Particle Detectors, edited by A. Barone (Work Scientific, Singapore)).

It was proved that radiation detecting devices using such superconductor materials are superior in performance to radiation detecting devices using semiconductor materials. But the energy resolving powers of these radiation detecting devices are larger by about one figure than 2.5 eV, the theoretical value estimated based on the energy gap of Sn. More improvement is required in their device structures. Furthermore, Fatally Sn is vulnerable to the heat cycle of the room temperature and the helium temperature, and tends to be degraded even during storage at the room temperature.

In view of this, development is under way on Josephson junctions using materials invulnerable to the heat cycle. Barone et al. showed that the use of Pb/NbOx/Nb junction with Nb, which is strong to the heat cycle, used as the lower electrode, and a reduced wire width can provide sharp pulse height spectra (A. Barone et al., Nucl. Instrum. and Methods, A234 (1985) 61, and others).

Applications of Nb/AlOx—Al/Nb junction, which has been successful in digital applications, in radiation detecting devices and other applications are tried (M. Kurakado and A. Matsumura, J.J. Appl. Phys., 28 (1989), L459; Japanese Laying-Open Hei 01-122179 (1989); and others). But their characteristics are not good in comparison with Sn/SnOx/Sn junction. To improve the characteristics, Kurakado et al. monocrystallized the lower electrode of Nb, whereby an energy resolving power of a 160 eV half-width was obtained for the application of 5.9 keV X rays (Kurakado et al., Technical Report of the Institute of Electronics and Communication Engineers, SCB90-19, pp 7). But the characteristics are still not good in comparison with Sn/SnOx/Sn junction.

SUMMARY OF THE INVENTION

An object of the present invention is to provide a radiation detecting device having good energy resolving power characteristics and high heat cycle durability, and a method for fabricating the device.

The above-described object of the present invention is achieved by a radiation detecting device comprising a substrate, a first superconductor layer formed on the substrate, a barrier layer formed on the first superconductor layer, and a second superconductor layer formed on the barrier layer, a junction formed of the first superconductor layer, the barrier layer and the second superconductor layer receiving radiation for detection thereof, the first superconductor layer being a Ta layer, the barrier layer including a TaOx layer, an AlOx layer, a HfOx layer or a ZrOx layer, a radiation stopping layer of a material having a large radiation stopping power being formed on the underside of the substrate, and an opening being formed in the substrate and the radiation stopping layer directly below the junction, radiation being incident to the junction through the opening.

The above-described object of the present invention is achieved by a radiation detecting device comprising a substrate, a first superconductor layer formed on the substrate, a barrier layer formed on the first superconductor layer, and a second superconductor layer formed on the barrier layer, a junction formed of the first superconductor layer, the barrier layer and the second superconductor layer receiving radiation for detection thereof, the first superconductor layer being a Ta layer, the barrier layer including a TaOx layer, an AlOx layer, a HfOx layer or a ZrOx layer, the substrate being formed of a material having a large radiation stopping power, and an opening being formed in the substrate directly below the junction, the opening reaching the first superconductor layer and passing radiation from the underside of the substrate to the junction.

It is preferable that a underlayer of Nb, V, W, Hf, Zr or Ti having a lattice constant approximate to that of Ta is formed directly below the first superconductor layer.

The above described object of the present invention is achieved by a method for fabricating the radiation detecting device comprising a substrate, a first superconductor layer formed on the substrate, a barrier layer formed on the first superconductor layer, and a second superconductor layer formed on the barrier layer, a junction formed of the first superconductor layer, the barrier layer and the second superconductor layer receiving radiation for detection thereof, the method comprising the steps of: forming on the substrate a underlayer of Nb, V, W, Hf, Zr or Ti; and forming on the underlayer a first superconductor layer of Ta without heating the substrate.

According to the present invention, the superconductor layer is provided by a Ta layer, and an opening is formed in a part of the substrate directly below the junction for emitting radiation, whereby the quasiparticles and the phonons can have longer lifetimes, sufficient heat cycle durability can be secured, escaping phonons can be minimized, and the irradiation position dependency can be decreased.

According to the present invention, a Ta layer is formed on a underlayer of Nb, V, W, Ff, Zr or Ti, whereby the Ta layer can stably have an α phase body cubic centered structure with a 4.5K superconductivity transition temperature.

BRIEF DESCRIPTION OF THE DRAWINGS

FIG. 1 a view of lifetimes of quasiparticles and phonons of typical superconductor materials;

FIGS. 9A-B are a view of the radiation detecting device according to a second embodiment of the present invention;

FIGS. 14A-B are a view of the radiation detecting device according to a fourth embodiment of the present invention;

DETAILED DESCRIPTION OF THE INVENTION

Figure 2:
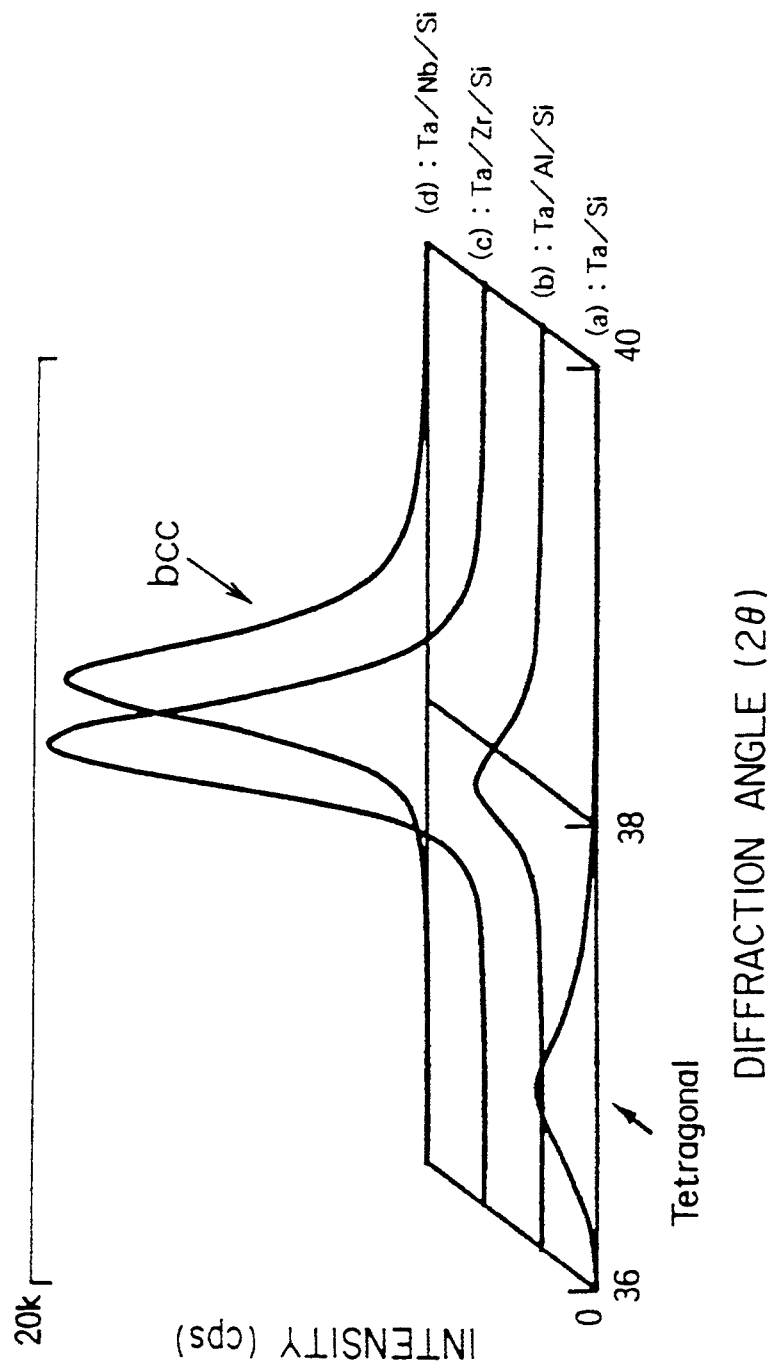
FIG. 2 is a graph of the experimental results of X-ray diffractions on a Ta layer formed on a silicon substrate through a underlayer.

First, the inventors of the present invention considered that to realize characteristics of high performance of a radiation detecting device using the non-equivalent superconducting phenomenon, it is very important to cause quasiparticles excited by phonons created by incident radiation to efficiently tunnel the barrier without losses on the way.

To this end, the inventors considered the following three points important:

(1) Quasiparticle lifetimes and phonon lifetimes of superconductor materials are long, (2) The structure of the device can preclude the escape of phonons.

(3) A position to be irradiated by radiation is selected.

In view of these points, the inventors of the present invention propose a radiation detecting device having an innovational device structure and using innovational device materials.

The radiation detecting device will be discussed firstly in connection with the point (1).

As regards materials of the device, as described above, Sn/SnOx/Sn junction has so far provided results of high performance. Stable Nb-based devices have only produced insufficient results. This is due to the substantial cause that there is a difference in a ratio of created quasiparticles tunneling the barrier efficiently, that is, without recombination. Based on this, the inventors considered that a material having a long quasiparticle lifetime is suitable for the radiation detecting device, and phonons with longer lifetimes can more efficiently create quasiparticles. Accordingly the inventors considered that both quasiparticles and phonons in a superconductor material should have long lifetimes for making a high sensitive detector.

Then, the inventors checked lifetimes of quasiparticles and phonons of typical superconductor materials. FIG. 1 shows lifetimes of quasiparticles and phonons of superconductor materials (Ienari Iguchi, Journal of Japan Physical Society, vol. 35, No. 4, p. 314). The values in FIG. 1 are values in the thermal equivalent state. It is not known whether they keep these values in actual non-equivalent states.

As shown in FIG. 1, it is seen that the so-called soft metals, such as Al, Sn, Pb, etc., have longer lifetimes of quasiparticles. It is seen that in contrast to this, quasiparticles of Nb have a shorter lifetime by more than one figure than those of Sn, and their lifetime is shorter. A lifetime of phonons of Nb is shorter by two figures than those of Sn. Thus, as for lifetimes of quasiparticles and phonons, Sn and Pb are suitable materials for the radiation detecting device. But Sn and Pb are unusabel because of poor thermal durability.

Ta, whose superconductivity transition temperature is 4.5K, has a little shorter phonon lifetime than Sn but has substantially the same quasiparticle lifetime as Sn. In addition, Ta has a high melting point as Nb, and has good heat cycle durability.

Then, the inventors adopted Ta as a superconductor material of the radiation detecting device, and adopted, based on the same idea of Nb/AlOx—Al/Nb junction, Ta/AlOx—Al/Ta junction (the barrier may be HfOx—Hf, ZrOx—Zr), or Ta/TaOx/Ta junction.

Next the point (2) will be discussed.

In superconductor phonons created by phonons, which are created by pair break due to incident radiation are used to break other electron pairs, which leads to the improvement of energy resolving powers. To this end, the inventors considered it important to minimize escaping phonons to effectively serve to break electron pairs.

In a superconductor formed on a substrate and having the upper surface contacting with liquid helium, it was checked on which of the upper and the lower surfaces of the superconductors more of phonons created in the superconductors escape. Escape of the phonons depends on a thermal conductivities of the substrate and the liquid helium. Because liquid helium has a lower thermal conductivity than the substrate, less phonons escape at the liquid helium. Accordingly the inventors considered that it is more efficient to apply radiation to the side of the liquid helium so as to effectively use the phonons for the generation of quasiparticles.

Next, the point (3) will be explained.

Although it is preferred to apply radiation to the side of the liquid helium of the superconductor, there is a problem that when the radiation is applied to the side of the liquid helium, i.e., to the side of the wiring, there is a problem that phonons escape through wires. As evident from the fact that an energy resolution was improved by reducing a wire width as described above, the irradiation position dependency, i.e., to which part of the superconductor junction radiation is applied to, is a problem in applying the radiation from the side of the liquid helium.

In view of this problem, in the present invention an opening is formed in a part of the substrate directly underneath the position which the junction is located. In this opening the lower electrode is in contact with the liquid helium so that radiation is emitted therefrom. Such device structure minimizes escaping phonons, and the problem of the irradiation position dependency can be solved.

Next, suitable substrate materials for emitting radiation from the opening in the substrate in the device structure of the present invention were considered. A problem is that when a substrate with a radiation stopping power is used, emitted radiation passes the part of the substrate except the opening and adversely enters the junction. This problem is conspicuous especially in array Junctions.

Then, the inventors thought it preferable to form a radiation stopping layer of a material of a radiation stopping power on the underside of a substrate of a smaller radiation stopping power, such as a silicon substrate or others. The material of large radiation stopping powers are exemplified by Ta, W, Hf, Pt, Au, etc. For example, the radiation stopping layer of an about 10 $\mu$m-thickness can sufficiently block X rays of, e.g., 5.9 KeV. For $\alpha$ rays or others of above 1 MeV, the radiation stopping layer preferably needs a thickness of above 50 $\mu$m.

Next, the crystal structure of Ta used as the superconductor material in the present invention will be considered.

The inventors thought it preferable to use, as a superconductor material, Ta, whose superconductivity transition temperature is 4.5K, from the viewpoints of its phonon lifetime, quasiparticle lifetime and heat cycle stability as described above. But it was found that it is hard to fabricate Ta with a body cubic centered structure (bcc).

Ta in bulk has bcc structure ($\alpha$ phase) with a Tc=4.5K, but, a Ta layer is apt to have tetragonal (Tetra) structures with Tc=0.5K. When a substrate temperature is low, Ta thin films can not stably have an $\alpha$ phase structure but has a $\beta$ phase (tetragonal) structure with a superconductivity transition temperature below 0.5K. When the substrate temperature is above 250° C., Ta thin films can stably have an $\alpha$ phase structure. But heating the substrate up to the high temperatures causes bad interfaces of the Josephson junction structure, and radiation detecting devices of good characteristics can not be fabricated.

Then the inventors thought that the suitable selection of a material of the underlayer of the Ta thin film would enable the Ta to have stably an $\alpha$ phase structure with a 4.5K superconductivity transition temperature without heating the substrate.

The underlayer dependence on the structure of Ta layer was studied. FIG. 2 shows the results of X-ray diffraction patterns of Ta layers formed on the silicon substrate through the various underlayers.

The 200 nm thick Ta layer was deposited directly on a (100) silicon substrate ((a):Ta/Si). The 200 nm thick Ta layer was deposited on the 10 nm thick Al layer on the (100) silicon substrate ((b): Ta/Al/Si). The 200 nm thick Ta layer was deposited on the 10 nm thick Zr layer on the (100) silicon substrate ((c): Ta/Zr/Si). The 200 nm thick Ta layer was deposited on the 10 nm thick Nb layer on the (100) silicon substrate ((e): Ta/Nb/Si). The crystal structures of these Ta layers were investigated. All Ta layers were formed without heating the silicon substrates.

As seen in FIG. 2, in the case (a), the Ta layer had a $\beta$ phase structure. In the cases (b), (c) and (d), the Ta layers had $\alpha$ phase structures. It is seen that especially in the case (d), in which the underlayer was Nb, and in the case (c), in which the underlayer was Zr, good $\alpha$ phase structures could be formed. Superconductivity of the Ta layers at 4.2K were investigated. In the case (b), in which the underlayer was Al, and in the case (a), in which no underlayer was formed, superconductivity was not exhibited at 4.2K. It is seen that in the cases (c) and (d), in which the underlayers were Zr and Nb, the Ta layers should superconductivity at 4.2K.

Figure 3:
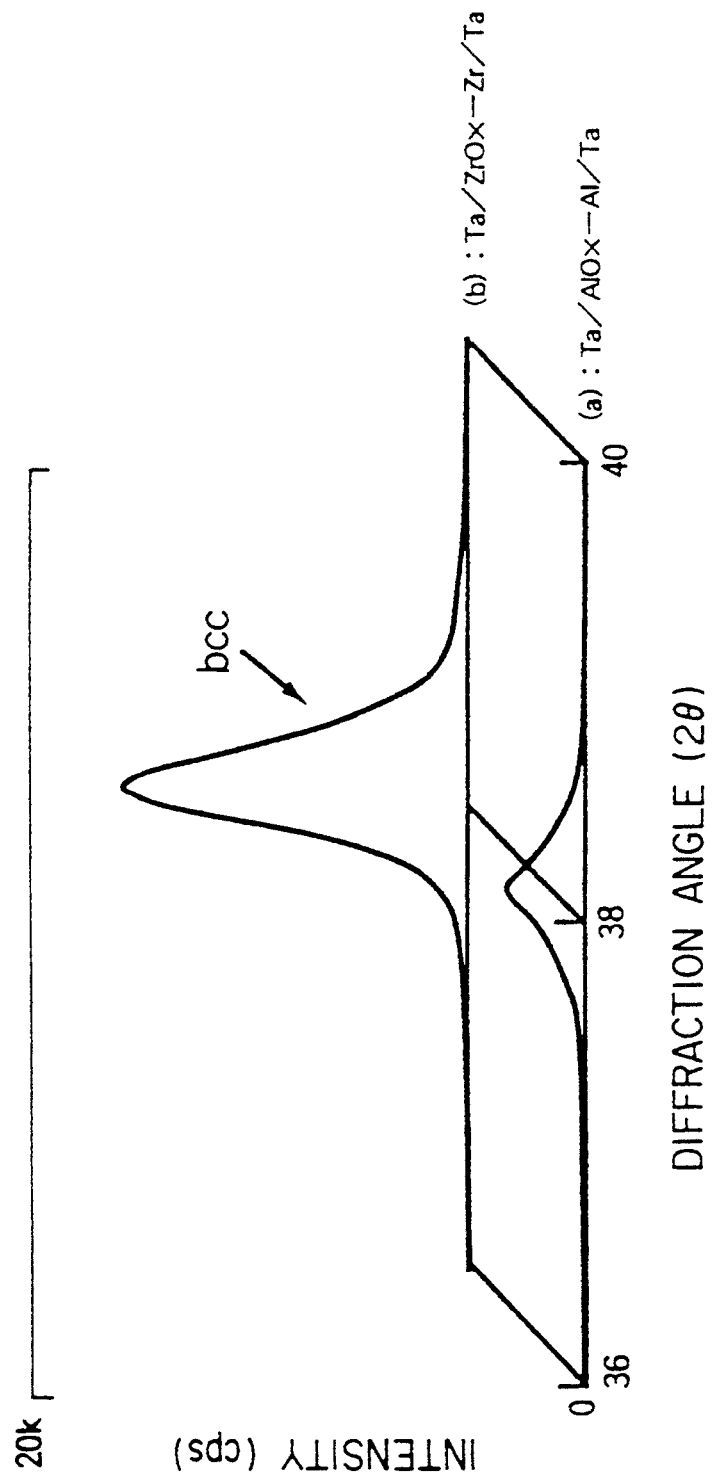
FIG. 3 is a graph of the experimental results of X-ray diffractions on the upper electrode Ta layer of a junction structure of a Ta upper electrode/a metal oxide-metal/a Ta lower electrode.

Then, crystal structure of Ta layers formed through metal oxide layers in a Ta upper electrode/metal oxide-metal/Ta lower electrode junction structure were measured. FIG. 3 shows the results of X-ray diffraction patterns of the upper electrode Ta layers.

The upper electrode Ta layers were formed in an about 200 nm-thickness on an about 10 nm thick AlOx—Al barrier layer on an about 200 nm thick Ta lower electrode ((a): Ta/AlOx—Al/Ta), and in an about 200 nm thickness on an about 200 nm thick Ta lower electrode through an about 10 nm thick ZrOx—Zr barrier layer ((b): Ta/ZrOx—Zr/Ta). Crystal structure of these Ta upper electrodes were investigated. The Ta layers were formed without heating the silicon substrates.

As seen in FIG. 3, it is seen that these Ta layers were $\alpha$ phase body cubic centered structures, but the crystal structure in the case (b): Ta/ZrOx—Zr/Ta, in which the barrier layer is Zr, was better than that in the case (a): Ta/AlOx—Al/Ta.

It is seen that a material of the barrier layer is very important to the crystal structure of the upper electrode Ta layer. As shown in FIG. 3, it is seen that Zr, for example, is more suitable for the upper conducting metal material. It was confirmed that the upper electrode Ta layer had also very good crystallinity in the case where Hf was used to form the HfOx—Hf barrier layer.

Figure 4:
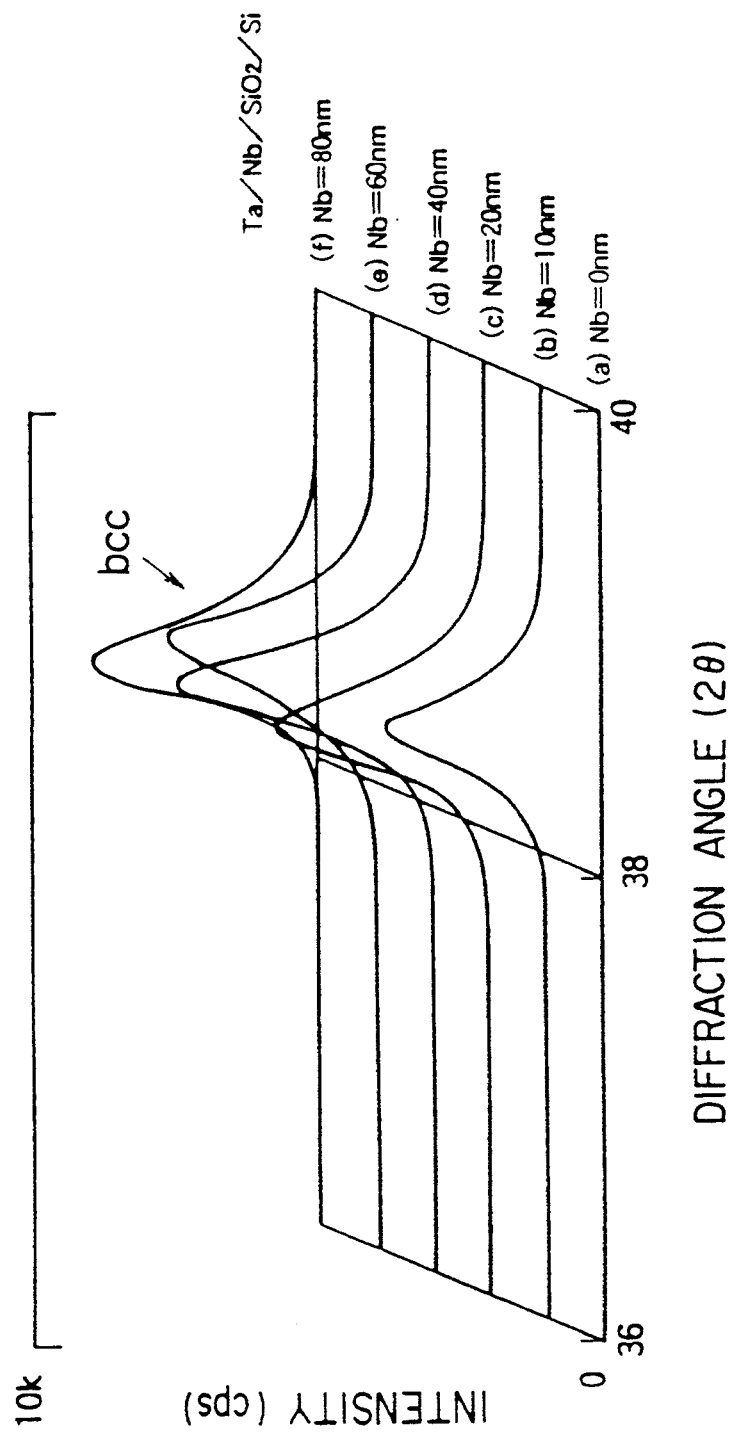
FIG. 4 is a graph of the experimental results of X-ray diffractions on a Ta layer as a wiring layer formed on a silicon oxide layer through a underlayer.

Then, in the case where Ta layers were used as wiring layers, influences of the underlayers on crystallinity of the Ta layers were measured. FIG. 4 shows results of X-ray diffractions patterns on the Ta layers. The underlayers were formed in different film thicknesses.

About 300 nm thick silicon oxide layers were formed as insulating layers on silicon substrates, and Nb layers with different thicknesses were formed as underlayers on the silicon oxide layers. On the underlayers were formed the Ta layers in an about 400 nm-thickness as the wiring layers. The thicknesses of the Nb layers used as the underlayers were 0 nm (a), 10 nm(b), 20 nm (c), 40 nm(c), 60 nm (d) and 80 nm (e).

As shown in FIG. 4, the Ta layer in the case (a) where no Nb layer as the underlayer was formed was amorphously not crystalline. But in the cases where the Nb layers as the underlayers were formed, the Ta layers had $\alpha$ phase cubic body centered structures. It is seen that the thicker Nb layer as the underlayer results in better crystallinity. Superconductivity of the Ta layers at 4.2K were investigated. The Ta layer deposited on the 10 nm thick Nb layer as the underlayer did not exhibit superconductivity at 4.2K, but the Ta layer exhibited superconductivity in all the cases (c), (d) and (e) in which the Nb layers as the underlayers had film thicknesses above 20 nm.

These experiments show that the use of a underlayer is effective to form an $\alpha$ phase Ta layer without heating the substrate. It was found that the use of especially a metal layer having a lattice constant approximate to that of Ta and a thickness above a set film thickness, as of Nb, V, W, Hf, Zr or Ti, is effective.

Next, the present invention will be explained in further detail on the basis of the preferred embodiments thereof.

Figure 5:
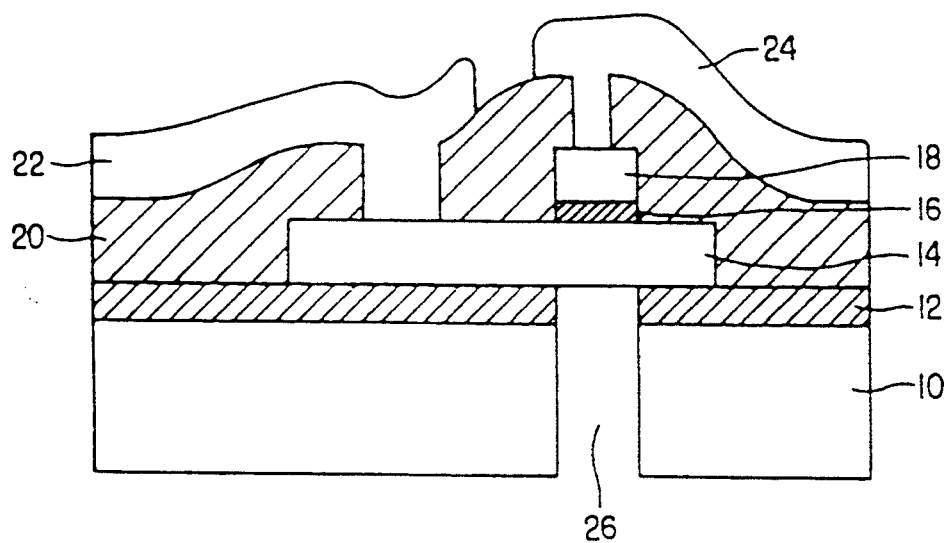
FIG. 5 is a sectional view of the radiation detecting device according to a first embodiment of the present invention.

The radiation detecting device according to a first embodiment of the present invention will be explained with reference to FIG. 5.

An about 100–300 nm thick $SiO_2$ layer 12 is formed on an about 100 $\mu$m thick Ta substrate. Ta layer 14 as an lower electrode is formed in an about 200 nm-thickness on the $SiO_2$ layer 12. An about 200 nm thick Ta layer 18 is formed on a part of the Ta layer 14 through a barrier layer 16, whereby a Josephson junction is formed.

The barrier layer 16 has a two-layer structure comprising an about 70 nm thick Al layer, and an about 10 nm thick AlOx layer formed by oxidizing the upper surface of the Al layer.

The Ta layers 14, 18 are covered by a $SiO_2$ layer 20. About 600 nm thick Ta wiring layers are formed on the $SiO_2$ layer 20, and the Ta wiring layer 22 is connected to the Ta layer 14 through a contact hole. The Ta wiring layer 24 is connected to the Ta layer 18 through a contact hole.

An opening 26 is formed in parts of the Ta substrate 10 and of the $SiO_2$ layer 12 directly below the Josephson junction formed by the Ta layer 14, the barrier layer 16 and the Ta layer 18 to be opened in the underside of the Ta substrate 10 and reaches the Ta layer 18.

When the device is used for radiation detection, the whole device is submerged in liquid helium. Radiation enters the underside of the Ta substrate 10 and enters through the opening 26 in the Ta substrate 10 the Josephson junction at the Ta layer 18, which is in contact with the liquid helium.

In the present embodiment, the Josephson junction comprises the Ta layers, whereby the qausiparticles and the phonon can have long lifetimes, and sufficient heat cycle stability can be secured. The opening in the parts of the Ta substrate and of the $SiO_2$ layer directly below the Josephson junction for the incident of radiation can serve to minimize escaping phonons and the irradiation position dependency.

Then the method for fabricating the radiation detecting device according to the first embodiment will be explained with reference to FIGS. 6 to 8.

Figure 6A:
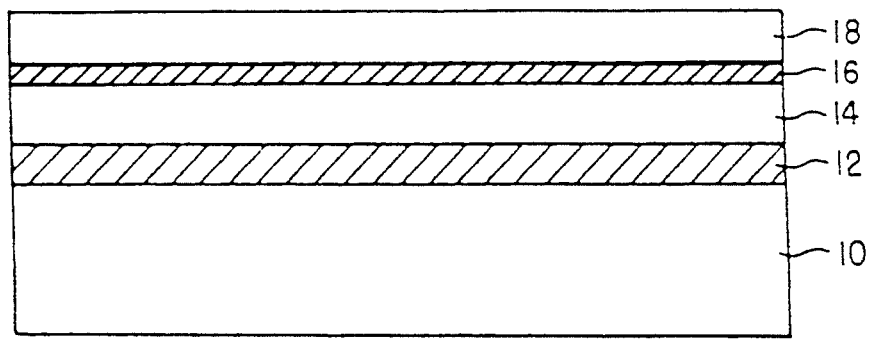
FIGS. 6A-C are sectional views (1) of steps of the method for fabricating the radiation detecting device according to the first embodiment of the present invention.

First, the $SiO_2$ layer 12 is formed in a 100–300 nm thickness on the Ta substrate 10 of an about 100 μm-thickness by sputtering or CVD. Then on the $SiO_2$ layer 12 the Ta layer 14 is deposited by sputtering in an about 200 nm-thickness. Then the Al layer is deposed in an about 7 nm-thickness by sputtering on the Ta layer 14, and then the surface of the Al layer is oxidized to thereby form the two-layer structure barrier layer 16 of AlOx—Al. Subsequently the Ta layer 18 is deposited by sputtering in an about 200 nm-thickness on the barrier layer 16 (FIG. 6A).

Figure 6B:
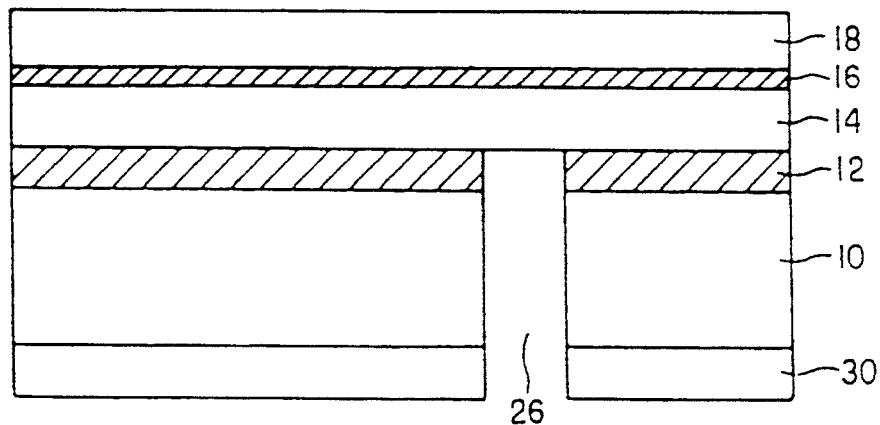

Then a resist layer 30 is formed on the underside of the Ta substrate 10. The resist layer 30 is so patterned that a region of the Ta substrate corresponding to a region for the Josephson junction to be formed in can be opened. With the resist layer 30 as the mask, the underside of the Ta substrate 10 is subjected to chemical etching with a liquid mixture of nitric acid and hydrochloric acid to form the opening 26. the chemical etching stops on the $SiO_2$ layer 12. The chemical etching ended on the $SiO_2$ layer 12 is followed by reactive ion etching (RIE) on the conditions of an 8 Pa pressure and a 50 W electric power to etch the $SiO_2$ layer 12. The RIE etching is set on until the Ta layer 14 is exposed (FIG. 6B).

Figure 6C:
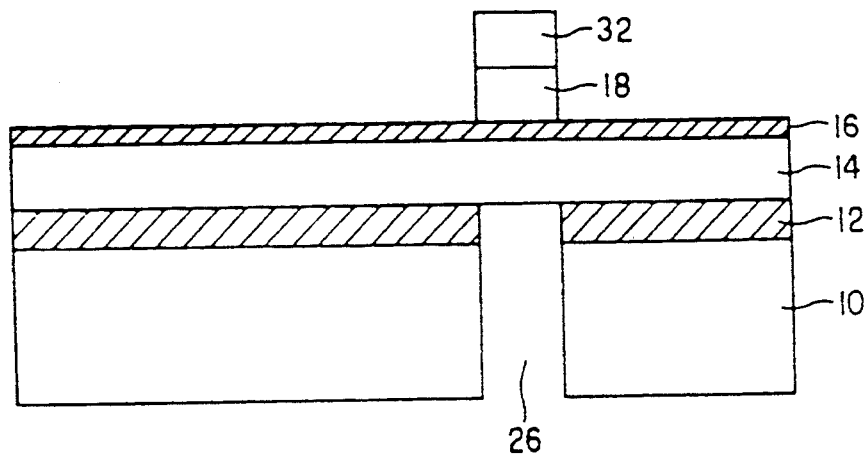

Subsequently, a resist layer 32 is formed on the Ta layer 18. The resist layer 32 is so patterned that a region of the Ta layer 18 for the Josephson junction to be formed in is left. With the resist layer 32 as the mask, the Ta layer 18 is etched with $CF_4+5\%O_2$ as the etching gas by reactive ion etching on the conditions of a 7 Pa pressure and a 50 W electric power. This etching stops on the barrier layer 16 (FIG. 6C).

Figure 7A:
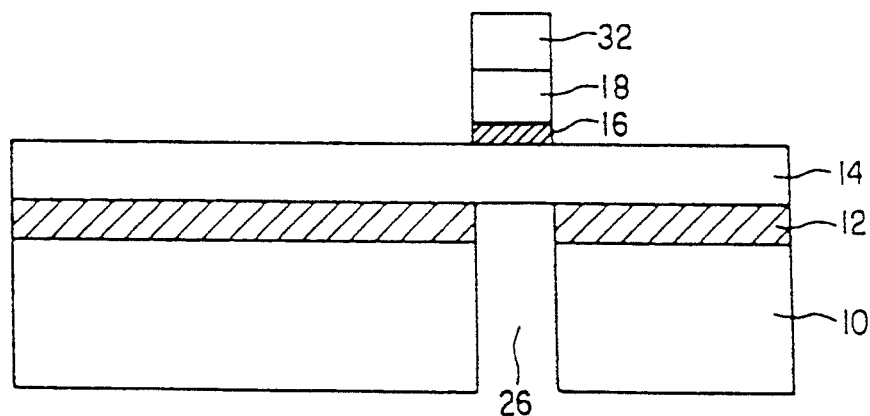
FIGS. 7A-C are sectional views (2) of steps of the method for fabricating the radiation detecting device according to the first embodiment of the present invention.

Then, with the resist layer 32 also as the mask, the AlOx—Al barrier layer 16 is etched with Ar gas by reactive ion etching on the conditions of a 1 Pa pressure and a 100 W electric power. This etching stops on the Ta layer 14 (FIG. 7A).

Figure 7B:
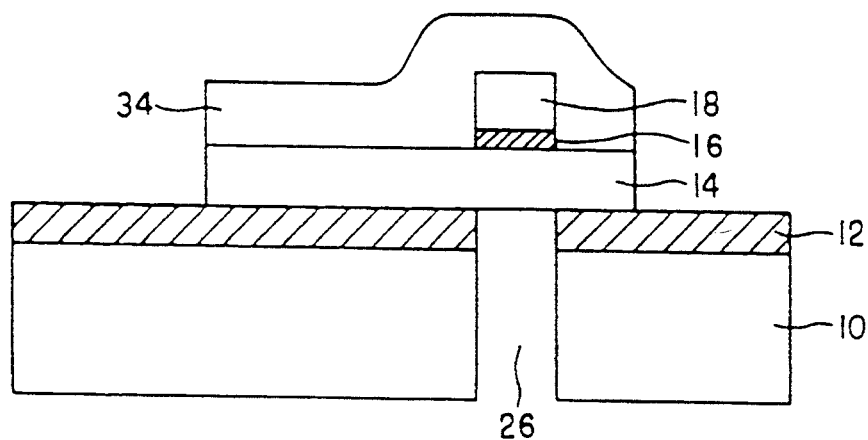

Next, a resist layer 34 is formed on the Ta layers 14, 18. This resist layer 34 is so patterned that a region for an lower electrode to be formed in is left. With the resist layer 34 as the mask, the Ta layer 18 is etched with $CF_4+5\%O_2$ gas as the etching gas on the conditions of a 7 Pa pressure and a 50 W electric power. This etching stops on the $SiO_2$ layer 12 (FIG. 7B).

Figure 7C:
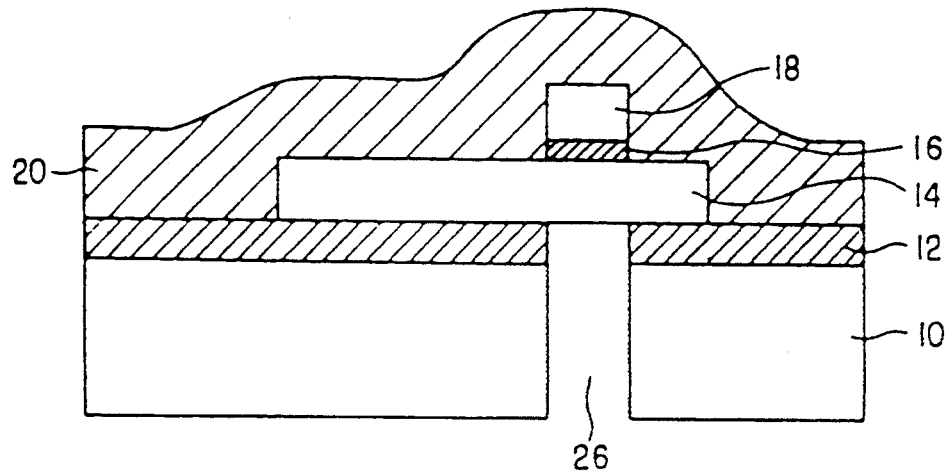

The $SiO_2$ layer 20 is deposited on the entire surface by sputtering using Ar gas on the conditions of a 900 W electric power and 3 Pa pressure (FIG. 7C).

Figure 8A:
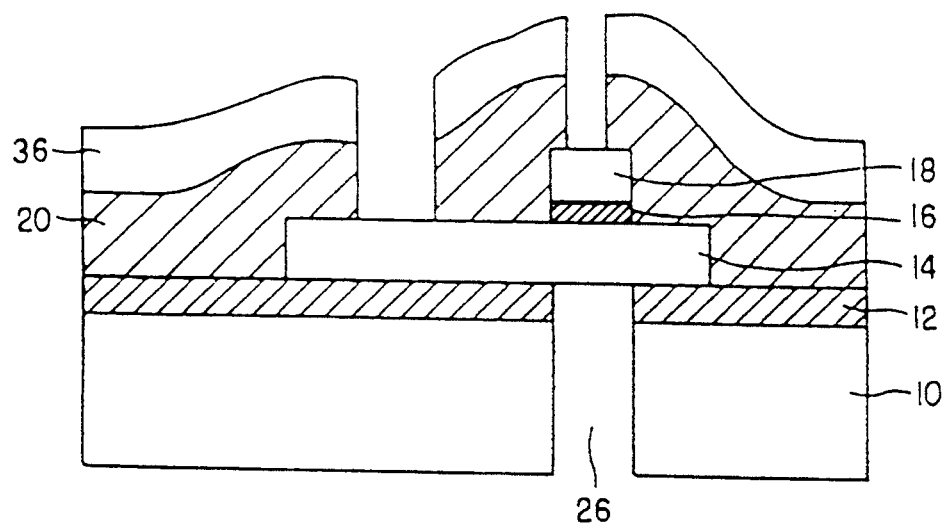
FIGS. 8A-B are sectional views (3) of steps of the method for fabricating the radiation detecting device according to the first embodiment of the present invention.

Then a resist layer 36 is formed on the $SiO_2$ layer 20. The resist layer 36 is so patterned for making contact holes. With the resist layer 36 as the mask, the $SiO_2$ layer 20 is etched using $CHF_3+30\%O_2$ gas by reactive ion etching on the conditions of a 7 Pa pressure and a 100 W electric power until the Ta layers 14, 18 are exposed (FIG. 8A).

Figure 8B:
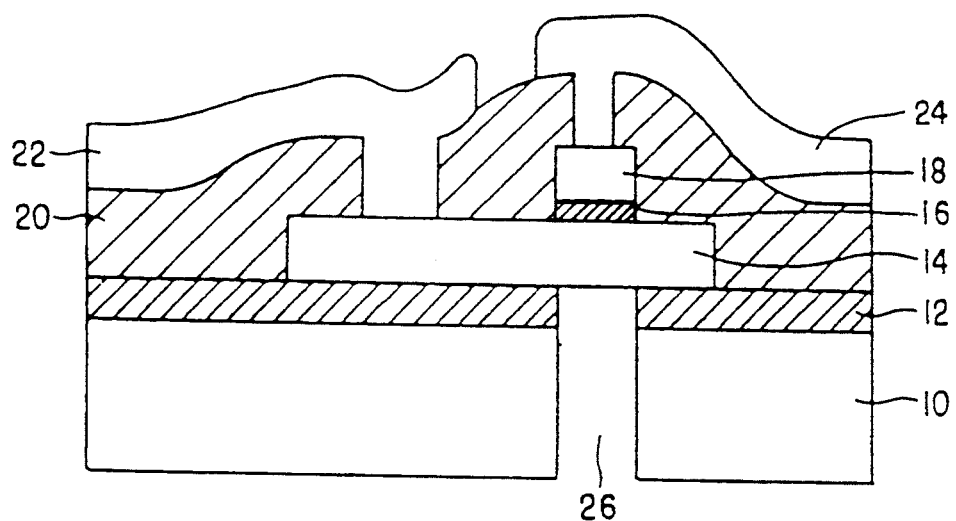

Next, the wiring layers 22, 24 of an about 600 nm-thickness are formed on the $SiO_2$ layer 20. The Ta wiring layer 22 is connected to the Ta layer 14 through the contact hole, and the Ta wiring layer 24 is connected to the Ta layer 18 through the contact hole (FIG. 8B). And the radiation detecting device according to the first embodiment is completed.

The radiation detecting device according to a second embodiment of the present invention will be explained with reference to FIG. 9. FIG. 9B is a plan view of the device, and FIG. 9A is a sectional view along the line A—A.

The radiation detecting device according to the second embodiment includes the Josephson junctions of the first embodiment arranged in an array. For example, about 1000 pieces of about 100 μm-square Josephson junctions are mounted in an array on a some mm-square Ta chip.

On a $SiO_2$ layer 12 formed on a Ta substrate 10, a plurality of Ta layers 14 are formed as lower electrodes. Ta layers 18 as upper electrodes are formed on the respective Ta layers 14 through respective AlOx—Al two-layer structure barrier layers 16. Thus a plurality of the Josephson junctions are arranged in an array.

Openings 26 are formed in the Ta substrate 10 and in the $SiO_2$ layer 20 from below at positions corresponding to the respective Josephson junctions.

The respective Ta layers 14, 18 are covered by a $SiO_2$ layer 20. On the $SiO_2$ layer 20 are formed Ta wiring layers 41, 42, 43, . . . , . . . Each wiring layer 41, 42, 43, . . . , . . . interconnects the upper electrode Ta layer 18 of each Josephson junction to the lower electrode super conducting layer 14 of its adjacent Josephson junction.

When the device is used for radiation detection, the whole device is submerged in liquid helium. Radiation enters the underside of the Ta substrate 10 and enters through the openings 26 in the Ta substrates 10 the Josephson junctions at the Ta layers 18, which is in contact with the liquid helium.

Thus, according to the second embodiment, a radiation detecting device also having the function of two-dimensional position detection can be fabricated.

Figure 10:
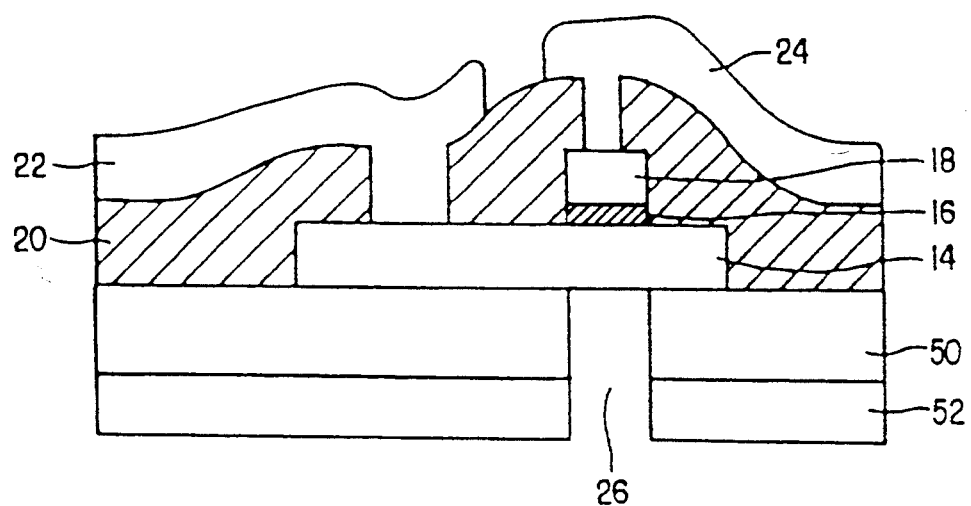
FIG. 10 is a sectional view of the radiation detecting device according to a third embodiment of the present invention.

The radiation detecting device according to a third embodiment of the present invention will be explained with reference to FIG. 10.

An about 50–100 μm thick Ta layer 52 is formed on the underside of an about 50 μm thick Si substrate 50. An about 200 nm thick Ta layer 14 as the lower electrode is formed on the Si substrate 50. An about 200 nm thick Ta layer 18 as the upper electrode is formed at a part of the Ta layer 14 through a barrier layer 16, whereby a Josephson junction is formed.

The barrier layer 16 has a two-layer structure comprising an about 7 nm thick Al layer, and an about 1 nm thick AlOx layer formed by oxidizing the upper surface of the Al layer.

The Ta layers 14, 18 are covered by a $SiO_2$ layer 20. About 600 nm thick Ta wiring layers are formed on the $SiO_2$ layer 20, and the Ta wiring layer 22 is connected to the Ta layer 14 through a contact hole. The Ta wiring layer 24 is connected to the Ta layer 18 through a contact hole.

An opening 26 is formed in parts of the Si substrate 50 and of the Ta layer 52 directly below the Josephson junction formed by the Ta layer 14, the barrier layer 16 and the Ta layer 18 to be opened in the underside of the Ta substrate 10 and reaches the Ta layer 18.

When the device is used for radiation detection, the whole device is submerged in liquid helium. Radiation enters the underside of the Si substrate 50 and enters through the opening 26 in the Si substrate 50 the Josephson junction at the Ta layer 18, which is in contact with the liquid helium.

The Ta wiring layers 22, 24 in the present embodiment may be replaced by Nb wiring layers.

In the present embodiment, the Josephson junction comprises the Ta layers, whereby the qausiparticles and the phonon can have long lifetimes, and sufficient heat cycle durability can be secured. The opening in the parts of the Si substrate and of the Ta layer directly below the Josephson junction for the incident of radiation can serve to minimize escaping phonons and the irradiation position dependency.

The method for fabricating the radiation detecting device according to the third embodiment will be explained with reference to FIGS. 11 to 13.

Figure 11A:
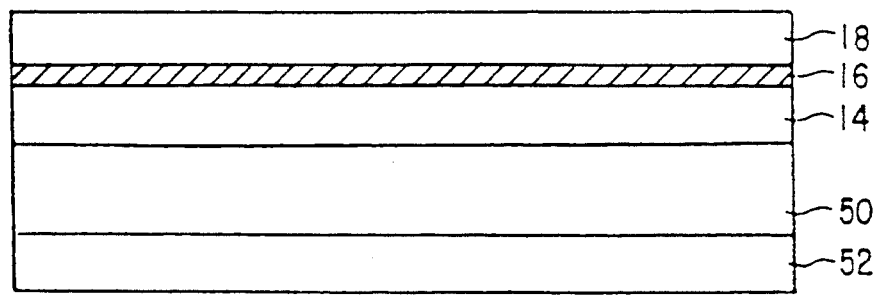
FIGS. 11A-C are sectional views (1) of steps of the method for fabricating the radiation detecting device according to the third embodiment of the present invention.

First, the Si substrate 50 in an about 300 μm thickness is grounded thinner down to about 50 μm. The Ta layer 52 is formed in an about 100 μm-thickness is formed on the underside of the about 50 μm thick Si substrate 50 by sputtering, CVD or other techniques. The Ta layer 52 is formed by DC magnetron sputtering in an atmosphere of Ar 1.3 Pa on the conditions of a 2.0 A current and a 300 V voltage. The deposition rate is about 200 nm/min. The Ta layer 14 is deposited in an about 200 nm-thickness on the Si substrate 50 by sputtering. Then, an about 7 nm thick Al layer is deposited on the Ta layer by sputtering and then oxidized on the surface to be formed into the barrier layer of the two layer structure. Subsequently the Ta layer 18 is formed in an about 200 nm-thickness on the barrier layer 16 by sputtering (FIG. 11A).

Figure 11B:
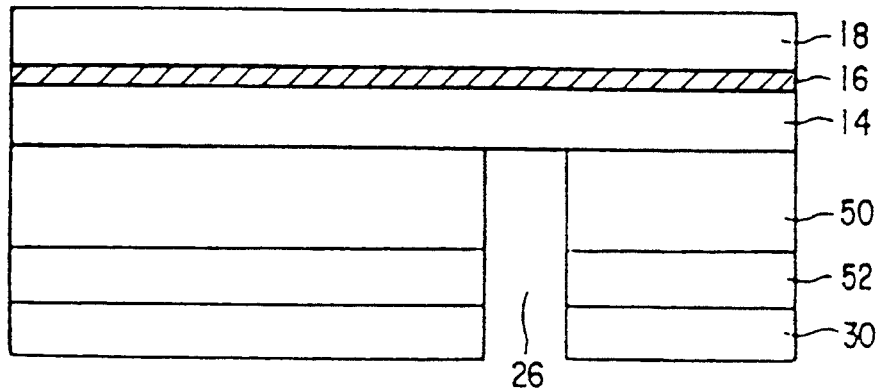

A resist layer 30 is formed on the underside of the Ta layer 52. The resist layer 30 is so patterned that a region of the Ta layer 52 corresponding to a region for the Josephson junction to be formed in is opened. With the resist layer 30 as the mask, the Ta layer 52 is etched off by reactive ion etching. The etching conditions were $CF_4 + 5\%O_2$ gas, 8 Pa and a 50 W electric power. Subsequently also with the resist layer 30 as the mask, the Si substrate 50 is chemically etched off with a liquid mixture of nitric acid and hydrochloric acid. Thus the opening 26 is formed with the Ta layer 14 exposed (FIG. 11B).

Figure 11C:
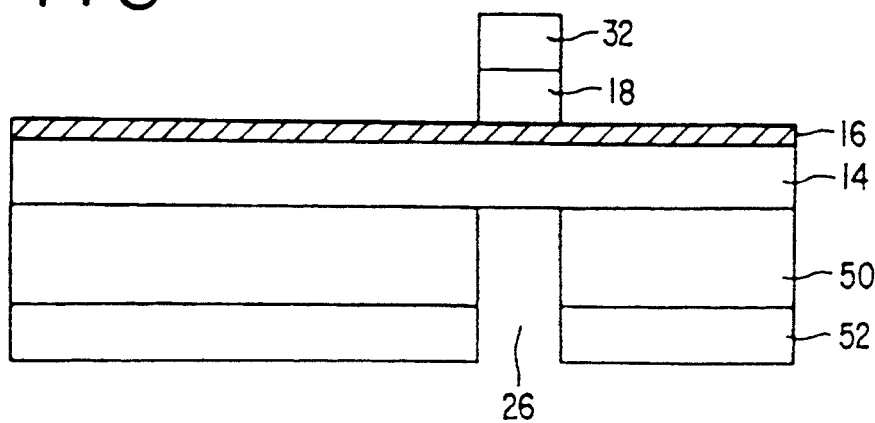

Then a resist layer 32 is formed on the Ta layer 18. The resist layer 32 is patterned to make the region for the Josephson junction. With the resist layer 32 as the mask, the Ta layer 18 is etched with $CF_4 + 5\%O_2$ gas by reactive ion etching on the conditions of a 7 Pa pressure and a 50 W electric power. This etching stops on the barrier layer 16 (FIG. 11C).

Figure 12A:
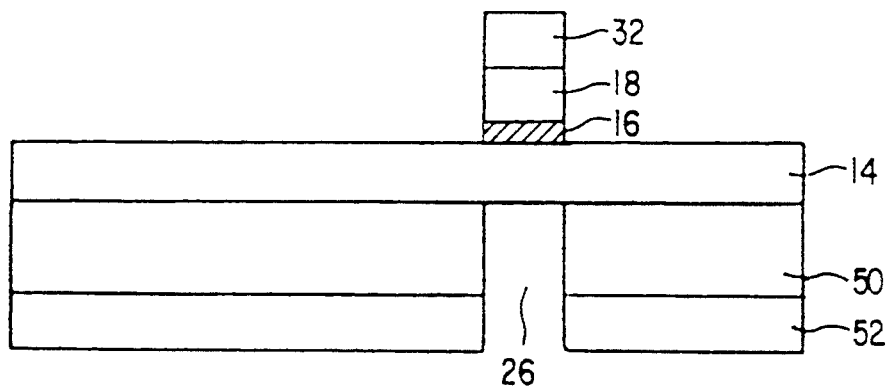
FIGS. 12A-C are sectional views (2) of steps of the method for fabricating the radiation detecting device according to the third embodiment of the present invention.

Then also with the resist layer 32 as the mask, the AlOx—Al barrier layer 16 is etched with Ar gas by reactive ion etching on the conditions of a 1 Pa pressure and a 100 W electric power. This etching stops on the Ta layer 14 (FIG. 12A).

Figure 12B:
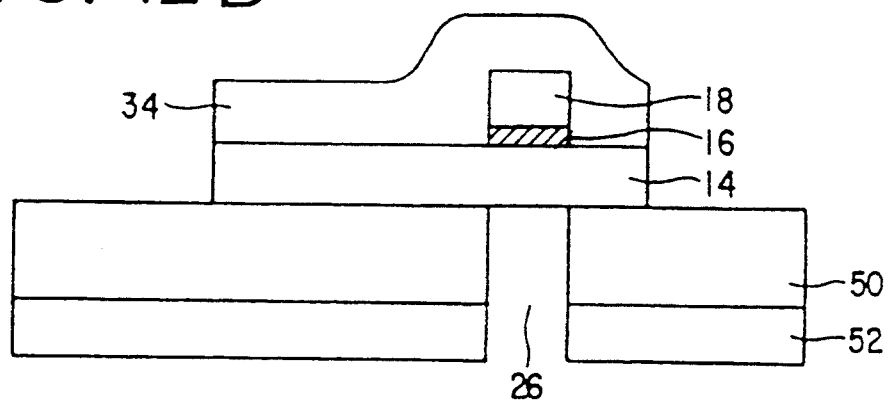

Next, a resist layer 34 is formed on the Ta layers 14, 18. The resist layer 34 is patterned to make a region for the lower electrode. With the resist layer 34 as the mask, the Ta layer 18 is etched with $CF_4 + 5\%O_2$ gas by reactive ion etching on the conditions of a 7 Pa pressure and a 50 W electric power. This etching stops on the Si substrate 50 (FIG. 12B).

Figure 12C:
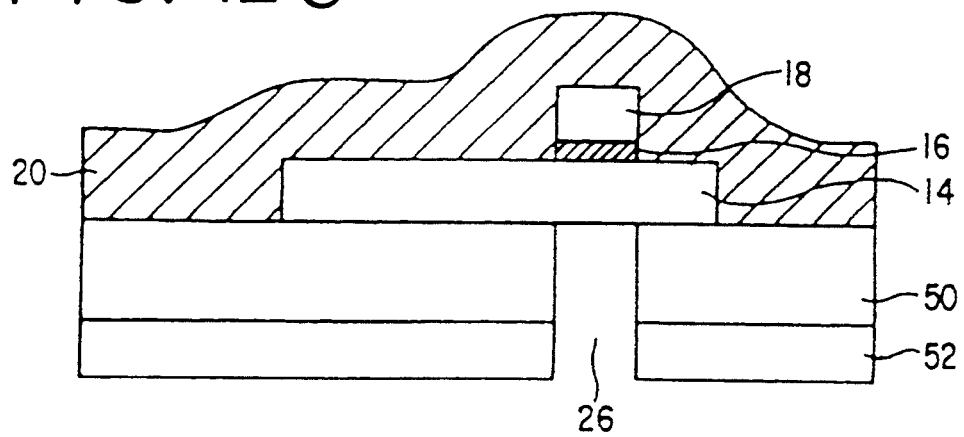

Subsequently the $SiO_2$ layer 20 is deposited on the entire surface by sputtering (FIG. 12C).

Figure 13A:
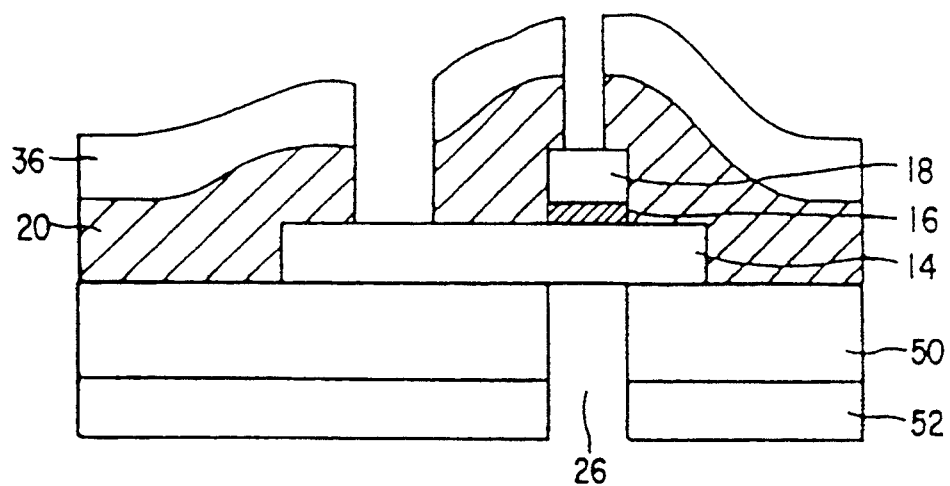
FIGS. 13A-B are sectional views (3) of step of the method for fabricating the radiation detecting device according to the third embodiment of the present invention.

Then a resist layer 36 is formed on the $SiO_2$ layer 20. The resist layer is patterned to make regions for the contact holes. With the resist layer 36 as the mask, the $SiO_2$ layer 20 is etched with $CHF_4 + 30\%O_2$ gas by reactive ion etching on the conditions of a 7 Pa pressure and a 100 W electric power until the Ta layers 14, 18 are exposed (FIG. 13A).

Figure 13B:
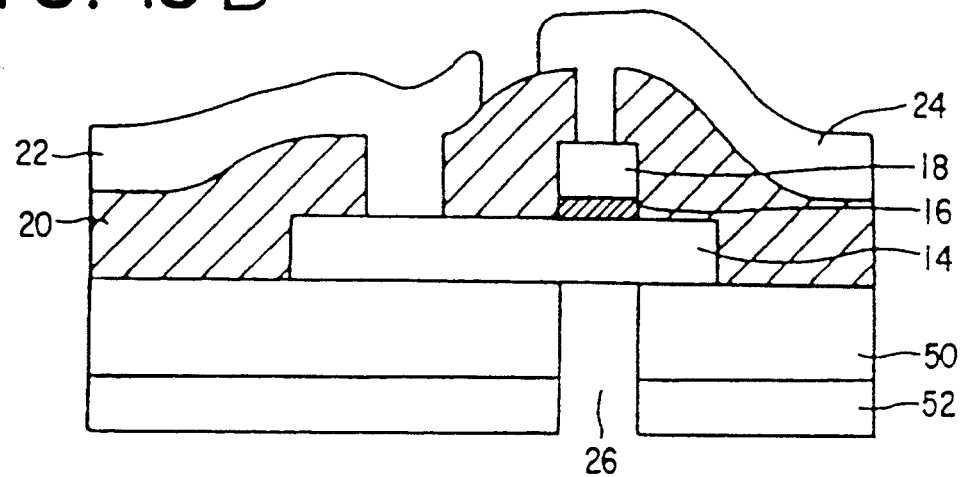

Then an about 600 nm thick Ta wiring layers 22, 24 are formed on the $SiO_2$ layer 20. The Ta wiring layer 22 is connected to the Ta layer 14 through the contact hole, and the Ta wiring layers 24 is connected to the Ta layer 18 through the contact hole (FIG. 13B). And the radiation detecting device according to the third embodiment is completed.

In the present embodiment, the Ta wiring layers 22, 24 may be replaced by Nb wiring layers.

The radiation detecting device according to a fourth embodiment of the present invention will be explained with reference to FIG. 14. FIG. 14B is a plan view of the fourth embodiment, and FIG. 14A is a sectional view along the line A—A.

The radiation detecting device according to the second embodiment includes the Josephson junctions of the first embodiment arranged in an array. For example, about 1000 pieces of about 100 μm-square Josephson junctions are mounted in an array on a some mm-square Ta chip.

A Ta layer 52 is formed on the underside of a Si substrate 50. A plurality of Ta layers 14 as lower electrodes are formed on the Si substrate 50. Ta layers 18 are formed on the respective Ta layers 14 through their respective AlOx—Al two-layer structure barrier layers 16. Thus a plurality of the Josephson junctions are formed in an array.

Openings 26 are formed in the Si substrate 50 and in the Ta layer 52 from below at positions corresponding to the Josephson junctions.

The respective Ta layers 14, 18 are covered by a $SiO_2$ layer 20. Ta wiring layers 41, 42, 43, . . . , . . . are formed on the $SiO_2$ layer 20. Each Ta wiring layer 41, 41, 43, . . . , . . . interconnects the upper electrode Ta layer 18 of each Josephson junction to the lower electrode Ta layer 14 of its adjacent Josephson junction.

When the device is used for radiation detection, the whole device is submerged in liquid helium. Radiation enters the Ta layer 52 on the Si substrate 50 and enters through the openings 26 in the Si substrate 50 the Josephson junctions at the Ta layer 18, which is in contact with the liquid helium.

In the present embodiment, the Ta wiring layers 41, 42, 43, . . . , . . . may be replaced by Nb wiring layers.

According to the present embodiment, a radiation detecting device also having the function of two-dimensional position detection can be fabricated.

Figure 15:
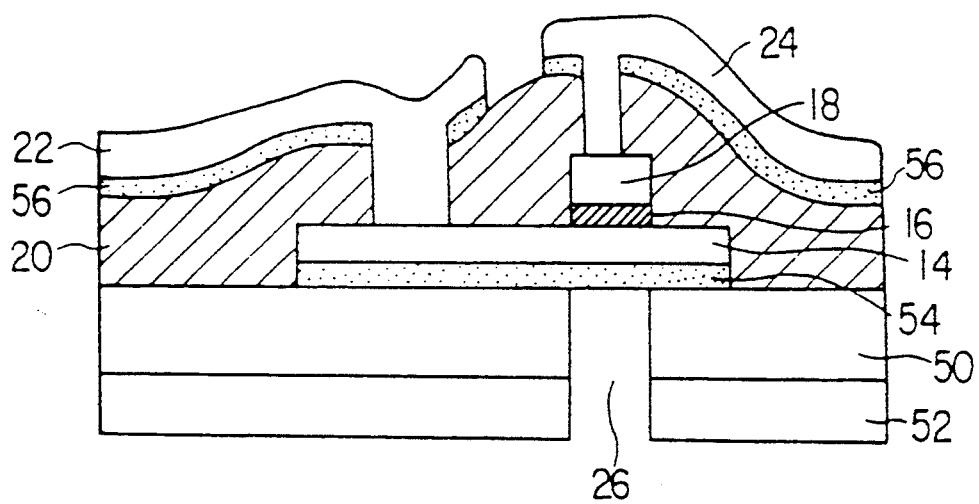
FIG. 15 is a sectional view of the radiation detecting device according to a fifth embodiment of the present invention.

The radiation detecting device according to a fifth embodiment of the present invention will be explained with reference to FIG. 15.

An about 0.5–100 μm thickness Ta layer 52 is formed on the underside of an about 50 μm thick Si substrate 50. An about 100 nm thick Nb underlayer 54 is formed on the Si substrate 50. An about 100 nm thick Ta layer 14 as a lower electrode is formed on the Nb underlayer 54. An about 200 nm thick Ta layer 18 is formed at a part of the Ta layer 14 through a barrier layer 16. Thus a Josephson junction is formed.

The barrier layer 16 has a ZrOx—Zr two-layer structure comprising an about 4 mm-thickness Zr layer, and an about 1 nm thick ZrOx layer formed by oxidizing the surface of the Zr layer.

The Ta layers 14, 18 are covered by an about 400 nm thick $SiO_2$ layer 20. An about 100 nm thick Nb underlayer 56 is formed on the $SiO_2$ layer 20. About 600 nm thick Ta wiring layers 22, 24 are formed on the Nb underlayer 56. The Ta wiring layer 22 is connected to the Ta layer 14 as the lower electrode through a contact hole, and the Ta wiring layer 24 is connected to the Ta layer 18 as the upper electrode through the contact hole.

An opening 26 is formed in a part of the Si substrate 50 and the Ta layer 52 directly below the Josephson junction comprising the Ta layer 14, the barrier layer 16 and the Ta layer 18. The opening 26 is opened in the underside of the Ta layer 52 and reaches the Ta layer 18.

When the device is used for radiation detection, the whole device is submerged in liquid helium. Radiation enters the underside of the Si substrate 50 and enters through the opening 26 in the Si substrate 50 the Josephson junction at the Ta layer 18, which is in contact with the liquid helium.

In the present embodiment, the ZrOx—Zr barrier layer directly below the upper electrode may be replaced by a barrier layer of HfOx—Hf or AlOx—Al.

The Nb underlayer directly below the Ta wiring layer may be replaced by a underlayer of V, W, Hf, Zr or Ti.

Also in the present embodiment, the Ta layer as the upper electrode may be replaced by a superconductor layer of Nb. An Nb wiring layer may replace the Nb underlayer 56 and the Ta wiring layers 22, 24.

In the present embodiment, the Josephson junction comprises the Ta superconductor layers, whereby the qausiparticles and the phonon can have long lifetimes, and sufficient heat cycle durability can be secured. The opening in the parts of the Si substrate and of the Ta layer directly below the Josephson junction for the incident of radiation can serve to minimize escaping phonons and the irradiation position dependency. Furthermore, the Nb underlayer is formed directly below the lower electrode Ta superconductor layer, the ZrOx—Zr two-layer structure barrier layer is formed directly below the upper electrode Ta superconductor layer, and the Nb underlayer is formed directly below the Ta wiring layer, whereby the lower electrode, the upper electrode and the wiring layers can be formed of Ta α phase body cubic centered structure having a 4.5K superconductivity transition temperature.

Figure 16A:
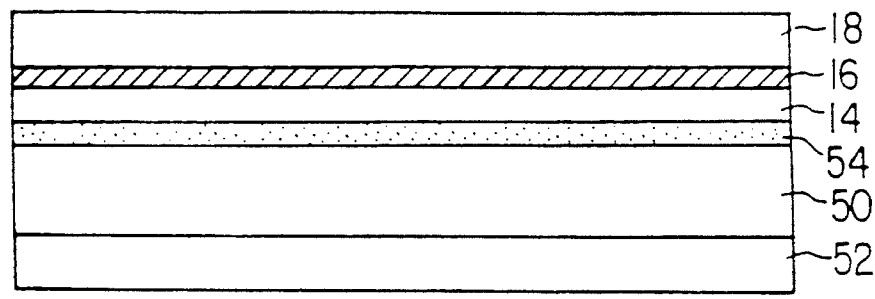
FIGS. 16A-C are sectional views (1) of steps of the method for fabricating the radiation detecting device according to the fifth embodiment of the present invention.
Figure 16B:
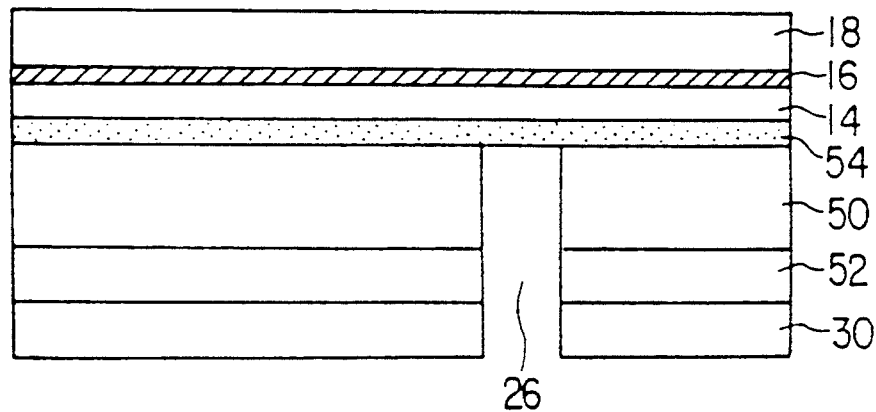
Figure 16C:
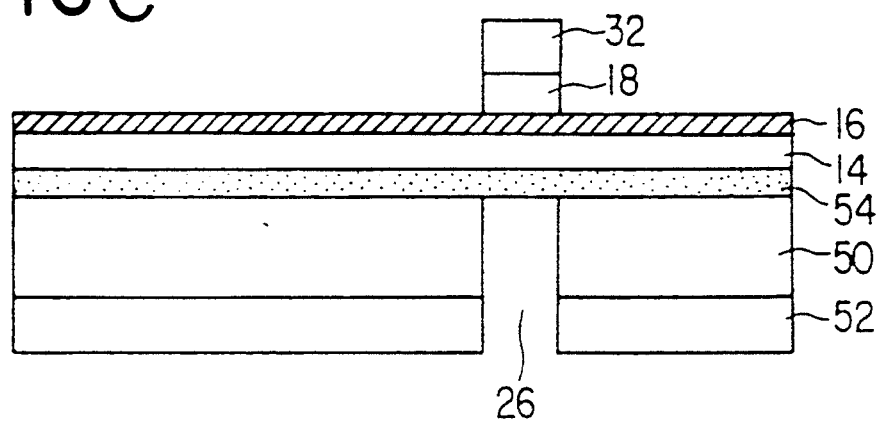

Then the radiation detecting device according to a fifth embodiment of the present invention will be explained with reference to FIGS. 16 to 18.

First, the Si substrate 50 in an about 300 μm-thickness is grounded thinner down to about 50 μm. The Ta layer 52 is formed in an about 100 μm-thickness is formed on the underside of the about 50 μm thick Si substrate 50 by sputtering, CVD or other techniques (FIG. 16A).

Then the Nb underlayer 54 is deposited on the Si substrate 50 by sputtering. Subsequently the Ta superconductor layer 14 is deposited on the Nb underlayer by sputtering. Next, the Zr layer is deposited in an about 4 nm-thickness on the Ta superconductor layer 14 by sputtering, and the surface is oxidized to form the ZrOx—Zr two-layer structure barrier layer 16. Then the Ta superconductor layer 18 is deposited on the barrier layer 16 by sputtering (FIG. 16A). In this step, the metals are deposited at a low substrate temperature without heating the Si substrate 10.

Then a resist layer 30 is formed on the underside of the Ta layer 52. The resist layer 30 is so patterned that a region of the Ta layer 52 corresponding to a region for a Josephson junction to be formed in is opened. With the resist layer 30 as the mask, the Ta layer 52 is etched off by reactive ion etching. Then again with the resist layer 30 as the mask, the Si substrate 50 is chemically etched with a liquid mixture of nitric acid and hydrochloric acid. Thus the opening 26 is formed with the Nb underlayer 54 exposed (FIG. 16B).

Then a resist layer 32 is formed on the Ta superconductor layer 18. The resist layer 32 is patterned to make a region for the Josephson. With the resist layer 32 as the mask, the Ta superconductor layer 18 is etched off with $CF_4+5\%O_2$ gas as the etching gas on the conditions of a 7 Pa pressure and a 50 W electric power. This etching stops on the barrier layer 16 (FIG. 16C).

Figure 17A:
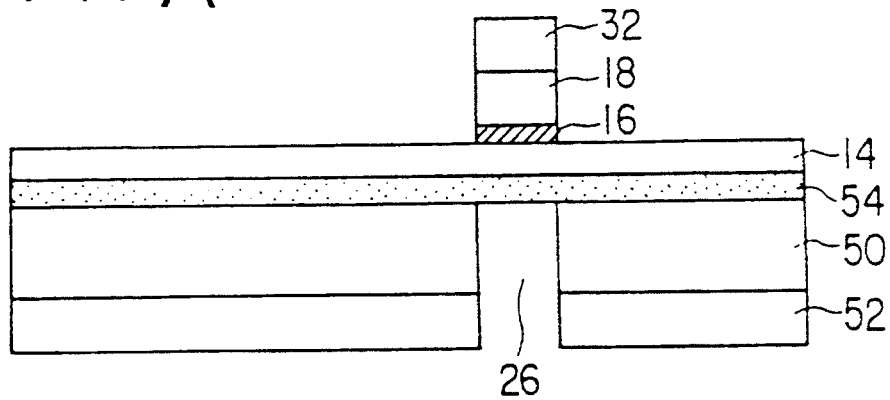
FIGS. 17A-C are sectional views (2) of steps of the method for fabricating the radiation detecting device according to the fifth embodiment of the present invention.

Then, again with the resist layer 32 as the mask, the ZrOx—Zr barrier layer 16 is etched with Ar gas by ion milling on the conditions of a 0.5 pa pressure and a 500 V electric voltage (FIG. 17A).

A resist layer 34 is formed on the Ta superconductor layers 14, 18. The resist layer 34 is so patterned that a region for the lower electrode to be formed in is left. With the resist layer 34 as the mask the Ta superconductor layer 14 is etched with $CF_4+5\%O_2$ gas by reactive ion etching on the conditions of a 7 Pa pressure and a 50 W electric power. Subsequently with the same resist layer 34 as the mask the Nb underlayer 54 is etched with the same condition. This etching stops on the Si substrate 50.

Figure 17B:
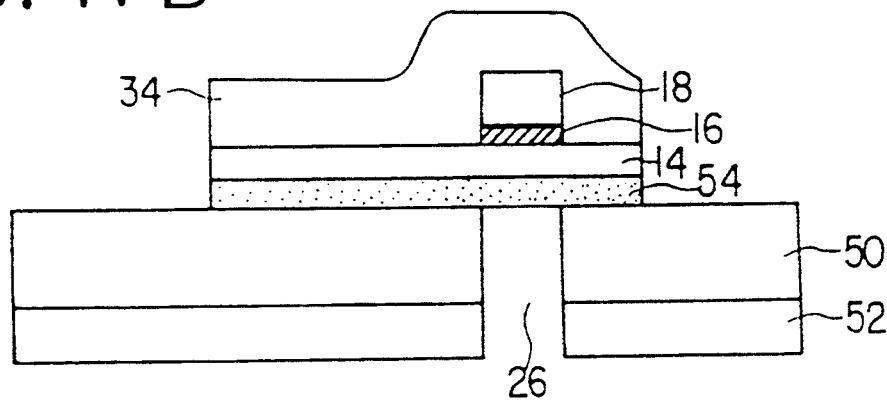
Figure 17C:
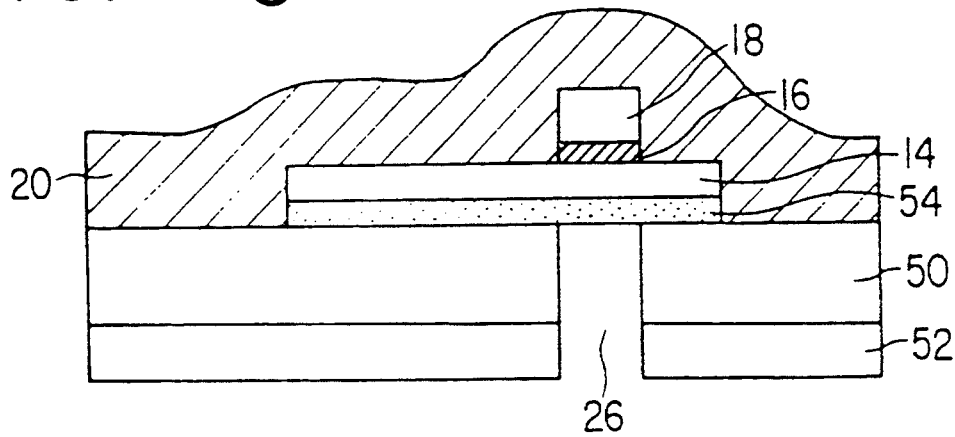

A $SiO_2$ layer 20 is deposited on the entire surface by the sputtering (FIG. 17B).

Figure 18A:
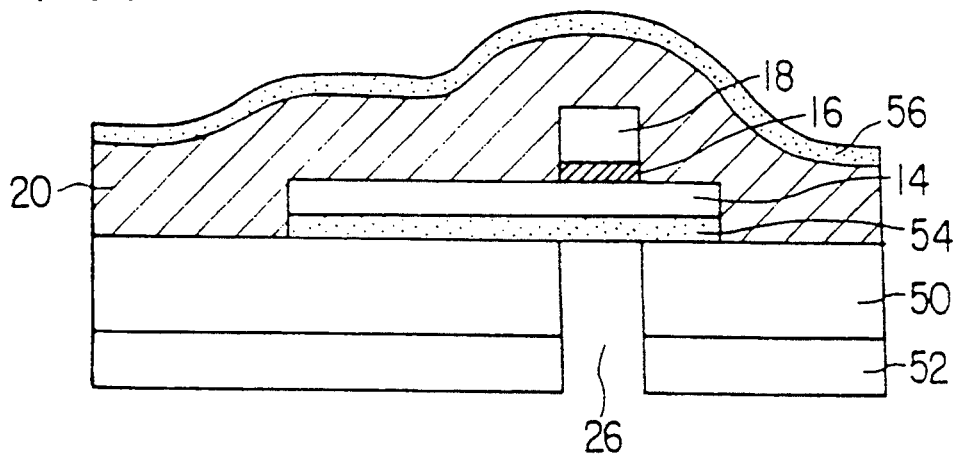
FIGS. 18A-C are sectional views (3) of steps of the method for fabricating the radiation detecting device according to the fifth embodiment of the present invention.

Then an Nb underlayer 56 is deposited by sputtering on the entire surface of the $SiO_2$ layer 20 (FIG. 18A).

Figure 18B:
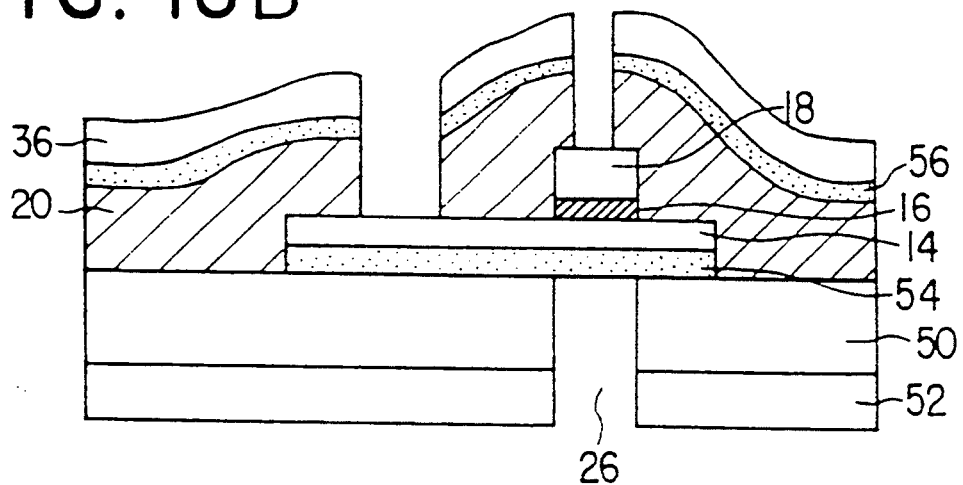

Next, a resist layer 36 is formed on the Nb underlayer 56. The resist layer 36 is patterned to make regions for contact holes. With the resist layer 36 as the mask, the Nb underlayer 56 is etched with $CF_4+5\%O_2$ gas by reactive ion etching on the conditions of a 7 Pa pressure and a 50 W electric power. Subsequently again with the resist layer 36 as the mask, the $SiO_2$ layer 20 is etched until the Ta superconductor layers 14, 18 are exposed (FIG. 18B).

Figure 18C:
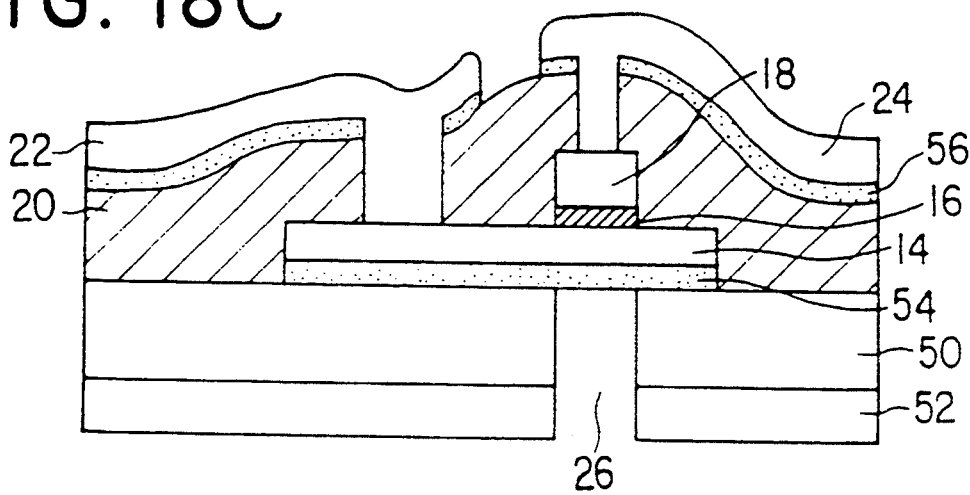

Next, about 600 nm thick Ta wiring layers 22, 24 are formed on the Nb underlayer 56. The Ta wiring layer 22 is connected to the Ta superconductor layer 14 through the contact hole, and the Ta wiring layer 24 is connected to the Ta superconductor layer 18 through the contact hole (FIG. 18C). And the radiation detecting device according to the fifth embodiment is completed.

Figure 19:
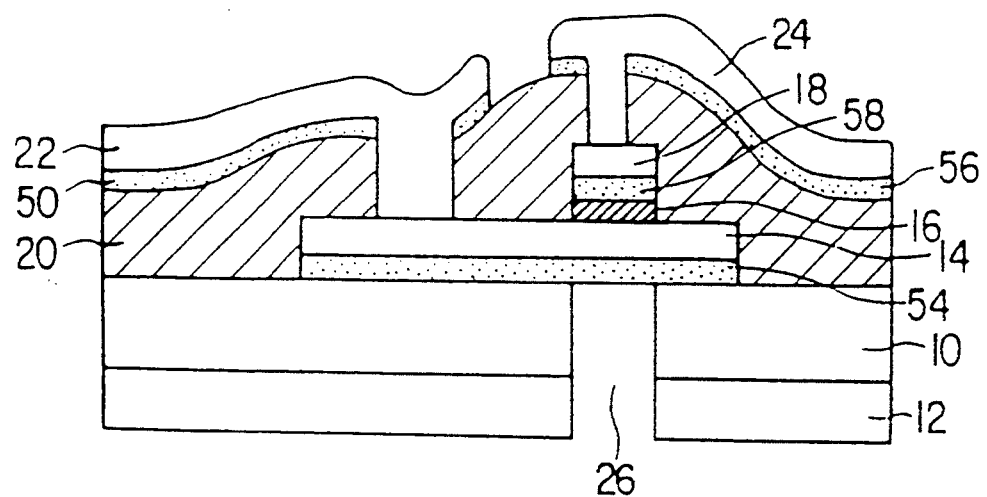
FIG. 19 is a view of the radiation detecting device according to a sixth embodiment of the present invention.

A radiation detecting device according to sixth embodiment of the present invention will be explained with reference to FIG. 19.

An about 0.5–100 μm thickness Ta layer 52 is formed on the underside of an about 50 μm thick Si substrate 50. An about 100 nm thick Nb underlayer 54 is formed on the Si substrate 50. A Ta superconductor layer 14 is formed as a lower electrode on the Nb underlayer 54.

A barrier layer 16 is formed on a part of the Ta superconductor layer 14. The barrier layer 16 has a Zr—ZrOx—Zr three-layer structure of an about 4 mm-thickness Zr layer, an about 1 nm thick ZrOx layer formed by oxidizing the surface of the Zr layer, and an about 4 nm thick Zr layer formed on the ZrOx layer.

An about 10 nm thick W underlayer 58 of W is formed on the barrier layer 16. An about 200 nm thick Ta superconductor layer 18 as an upper electrode is formed on the W underlayer 58. thus a Josephson junction is formed.

The Ta superconductor layers 14, 18 are covered with an about 400 nm thick $SiO_2$ layer 20. An about 100 nm thick Nb underlayer 56 is formed on the $SiO_2$ layer 20. About 600 nm thick wiring layers 22, 23 are formed on the Nb underlayer 56. The Ta wiring layer 22 is connected to the Ta superconductor layer 14, and the Ta wiring layer 24 is connected to the Ta superconductor layer 18 through the contact hole.

An opening 26 is formed in a part of the Si substrate 50 and the Ta layer 52 directly below the Josephson junction of the Ta superconductor layer 14, the barrier layer 16 and the Ta superconductor layer 18. The opening 26 is extended from the underside to the Ta superconductor layer 18.

When the device is used for radiation detection, the whole device is submerged in liquid helium. Radiation enters the underside of the Si substrate 50 and enters through the opening 26 in the Si substrate 50 the Josephson junction at the Ta superconductor layer 18, which is in contact with the liquid helium.

In the present embodiment, the Nb underlayer directly below the lower electrode may be replaced by a underlayer of V, W, Hf, Zr or Ti.

The W layer directly below the upper electrode may be replaced by a underlayer of V or Ti.

The Zr—ZrOx—Zr barrier layer may be replaced by a Hf—HfOx—Hf barrier layer or an Al—AlOx—Al barrier layer. A two-layer structure of ZrOx—Zr, HfOx—Hf, AlOx—Al or others may replace the Zr—ZrOx—Zr barrier layer. The presence of the underlayer directly below the upper electrode permits the use of the barrier layer of Al.

In the present embodiment, the Nb underlayer directly below the Ta wiring layer may be replaced by a underlayer of V, W, Hf, Zr or Ti.

In the present embodiment, the upper electrode Ta superconductor layer may be replaced by a superconductor layer of Nb. The Nb underlayer 56 and the Ta wiring layers 22, 24 may be replaced by an Nb wiring layer.

In the present embodiment, the Josephson junction comprises the Ta superconductor layers, whereby the qausiparticles and the phonon can have long lifetimes, and sufficient heat cycle durability can be secured. The opening in the parts of the Si substrate and of the Ta layer directly below the Josephson junction for the incident of radiation can serve to minimize escaping phonons and the irradiation position dependency. Furthermore, the Nb underlayer is formed directly below the lower electrode Ta superconductor layer, the W underlayer is formed directly below the upper electrode Ta superconductor layer, the Nb underlayer is formed directly below the Ta wiring layer, whereby the lower electrode, the upper electrode and the wiring layers can be formed of Ta α phase body cubic centered structure having a 4.5K superconductivity transition temperature.

Then the method for fabricating the radiation detecting device according to the sixth embodiment will be explained with reference to FIGS. 20 to 22.

Figure 20A:
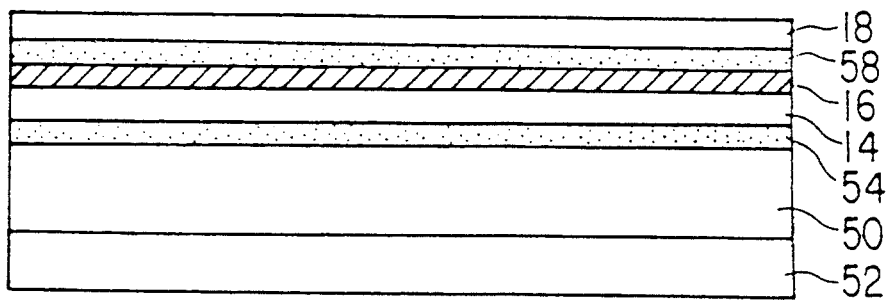
FIGS. 20A-C are sectional views (1) of steps of the method for fabricating the radiation detecting device according to the sixth embodiment of the present invention.

First the Si substrate 50 of an about 300 μm thickness is grounded thinner down to about 50 μm. Then the Ta layer 52 is formed in an about 0.5-100 μm thickness on the underside of the Si substrate 50 by sputtering, CVD or other techniques (FIG. 20A).

Subsequently the Nb underlayer 54 is deposited on the Si substrate 50 by sputtering. Then the Ta superconductor layer 14 is deposited on the Nb underlayer 54 by sputtering. Next, the Zr layer is deposited in an about 4 nm-thickness on the Ta superconductor layer 14 by sputtering. Then, the surface of the Zr layer is oxidized to form a ZrOx layer. Next, the Zr layer is deposited in an about 4 nm-thickness on the ZrOx layer by sputtering to form the Zr—ZrOx—Zr three-layer structure barrier layer 16. Subsequently the W underlayer 58 is deposited on the barrier layer 16 by sputtering. Then the Ta superconductor layer 18 is deposited on the W underlayer 59 by sputtering (FIG. 20A). The metals are deposited at a low substrate temperature without heating the substrate.

Figure 20B:
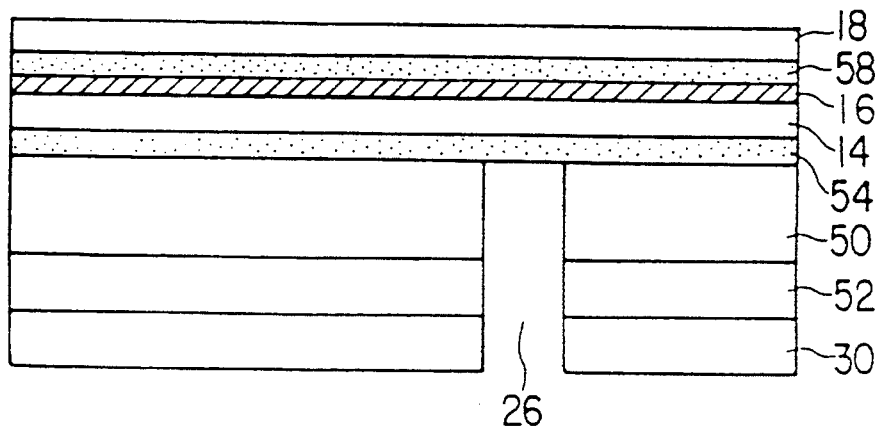

A resist layer 30 is formed on the underside of the Ta layer 52. The resist layer 30 is patterned to make a region of the Ta layer 52 corresponding to a region for the Josephson. With the resist layer 30 as the mask, the Ta layer 52 is etched off by reactive ion etching. Subsequently again with the resist layer 30 as the mask, the Si substrate 50 is chemically etched with a liquid mixture of nitric acid and hydrochloric acid. Thus the opening 26 is formed with the Nb underlayer 54 exposed (FIG. 20B).

Figure 20C:
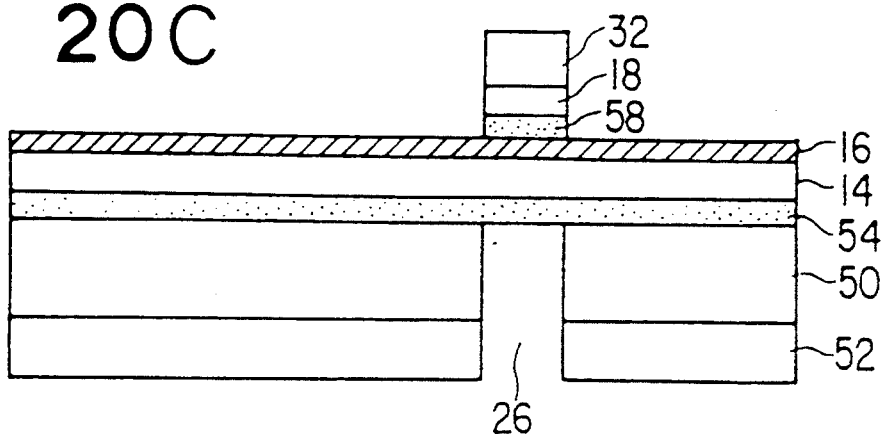

Then a resist layer 32 is formed on the Ta superconductor layer 18. The resist layer 32 is patterned to make the region for the Josephson junction. With the resist layer 32 as the mask, the Ta superconductor layer 18 is etched by reactive ion etching. Subsequently the W underlayer 58 is etched with $CF_4+5\%O_2$ gas by reactive ion etching on the conditions of a 7 Pa pressure and a 50 W electric power. This etching stops on the barrier layer 16 (FIG. 20C).

Figure 21A:
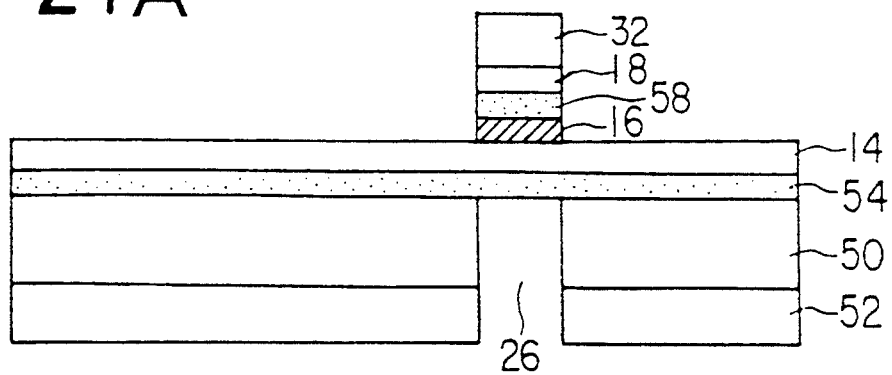
FIGS. 21A-C are sectional views (2) of steps of the method for fabricating the radiation detecting device according to the sixth embodiment of the present invention.

Then again with the resist layer 32 as the mask, the Zr—ZrOx—Zr barrier layer 16 is etched with Ar gas by ion milling on the conditions a 0.5 Pa pressure and a 500 V electric voltage. This etching stops on the Ta superconductor layer 14 (FIG. 21A).

Figure 21B:
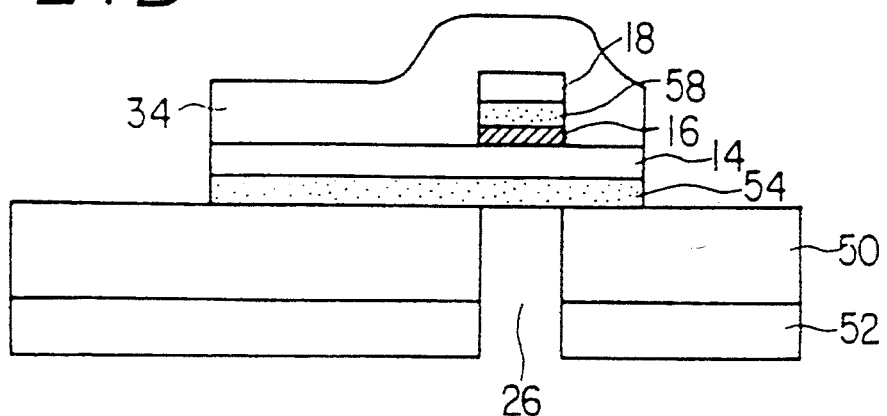

Subsequently a resist layer 34 is formed on the Ta superconductor layers 14, 18. The resist layer 34 is so patterned that a region for the lower electrode to be formed in is left. With the resist layer 34 as the mask, the Ta superconductor layer 14 is etched by reactive ion etching. Then, again with the resist layer 34 as the mask, the Nb underlayer 54 is etched by reactive ion etching. This etching stops on the Si substrate 50 (FIG. 21B).

Figure 21C:
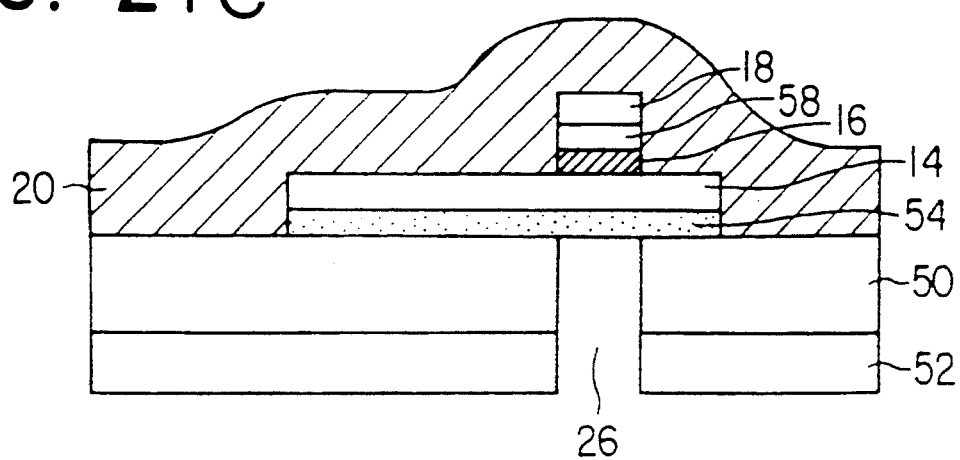

Then the $SiO_2$ layer 20 is deposed on the entire surface by sputtering (FIG. 21C).

Figure 22A:
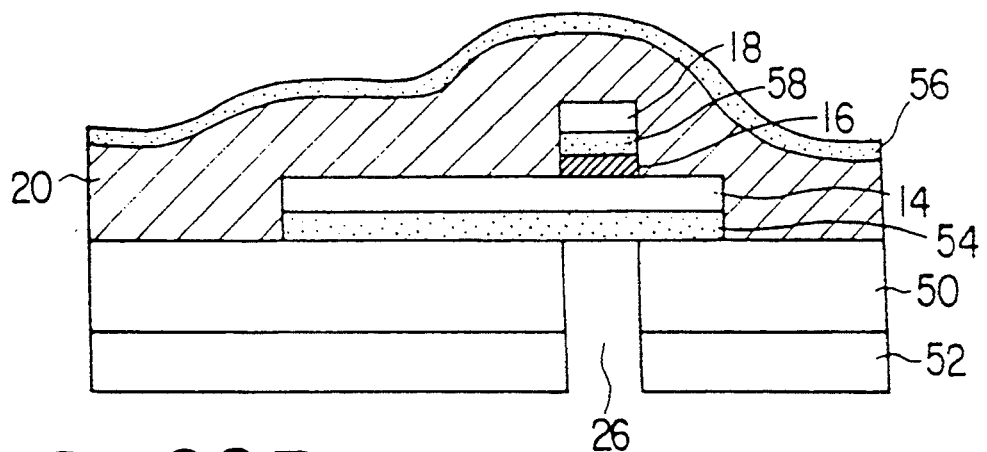
FIGS. 22A-C are sectional views (3) of steps of the method for fabricating the radiation detecting device according to the sixth embodiment of the present invention.

Next, the Nb underlayer 56 is deposited on the entire surface of the $SiO_2$ layer 20 by sputtering (FIG. 22A).

Figure 22B:
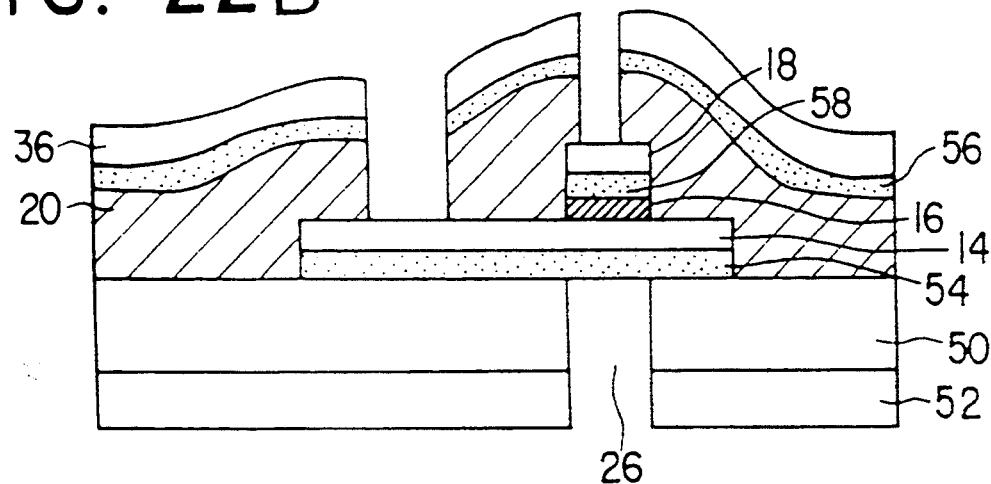

Subsequently a resist layer 36 is formed on the Nb underlayer 56. The resist layer 36 is patterned to make regions for contact holes. With the resist layer 36 as the mask, the $SiO_2$ layer 20 is etched by reactive ion etching until the Ta superconductor layers 14, 18 are exposed (FIG. 22B).

Figure 22C:
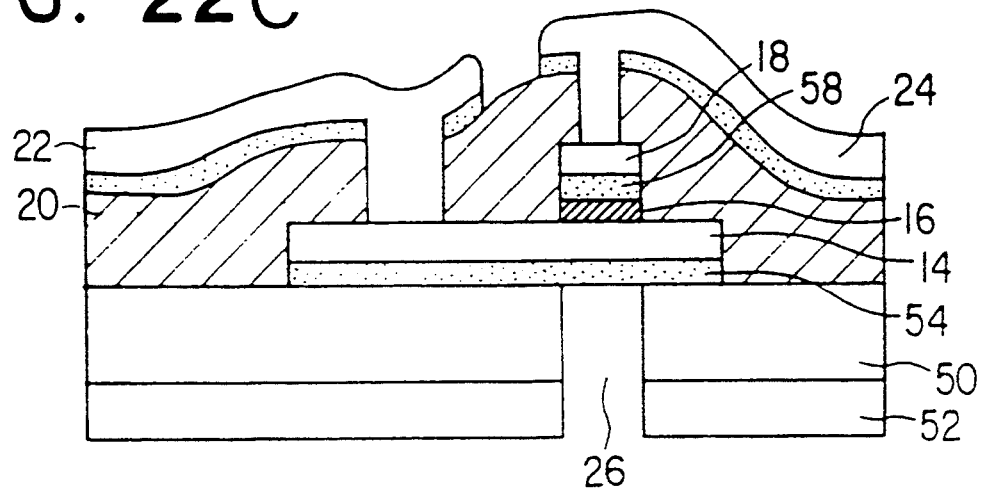
Figure 23:
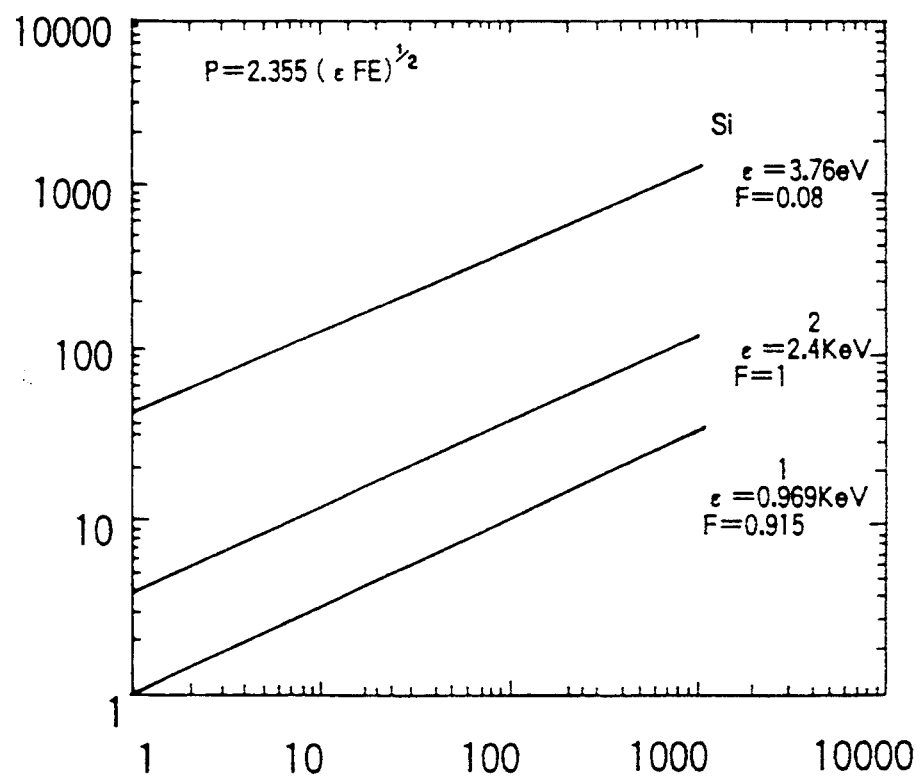
FIG. 23 is a graph of relationships between energy resolving powers of superconductor materials and of semiconductor materials, and incident energy.
Figure 24:
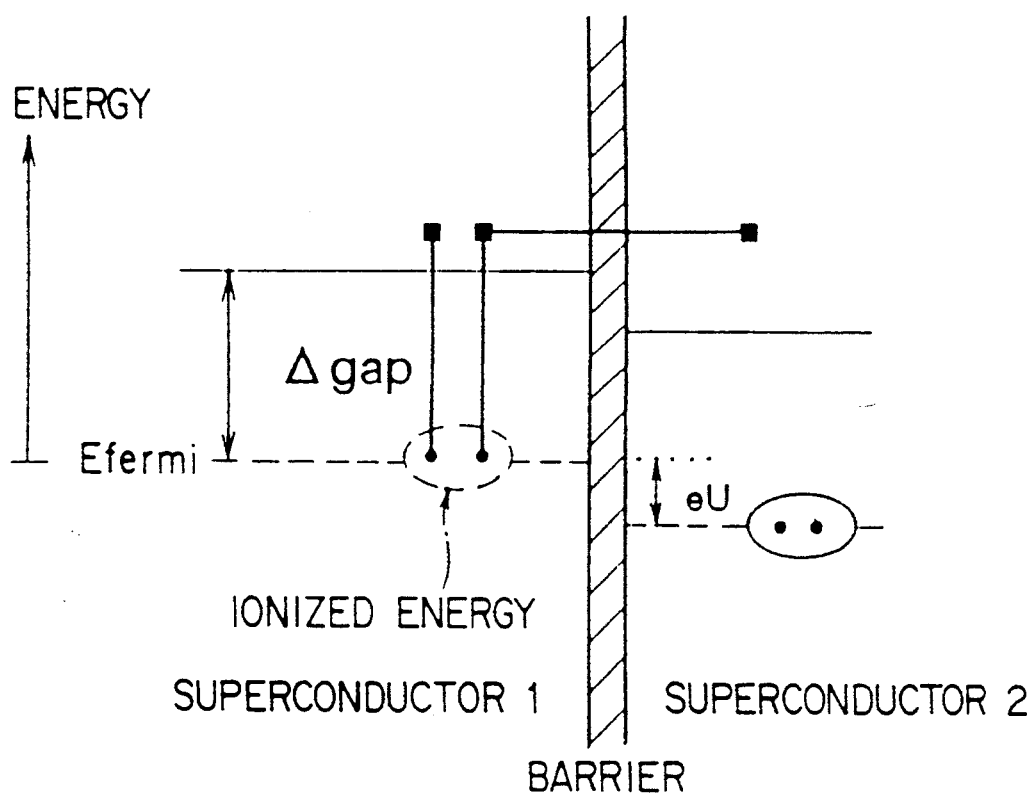
FIG. 24 is an explanatory view of a tunneling process of a Josephson junction when radiation is incident thereon.
Figure 25:
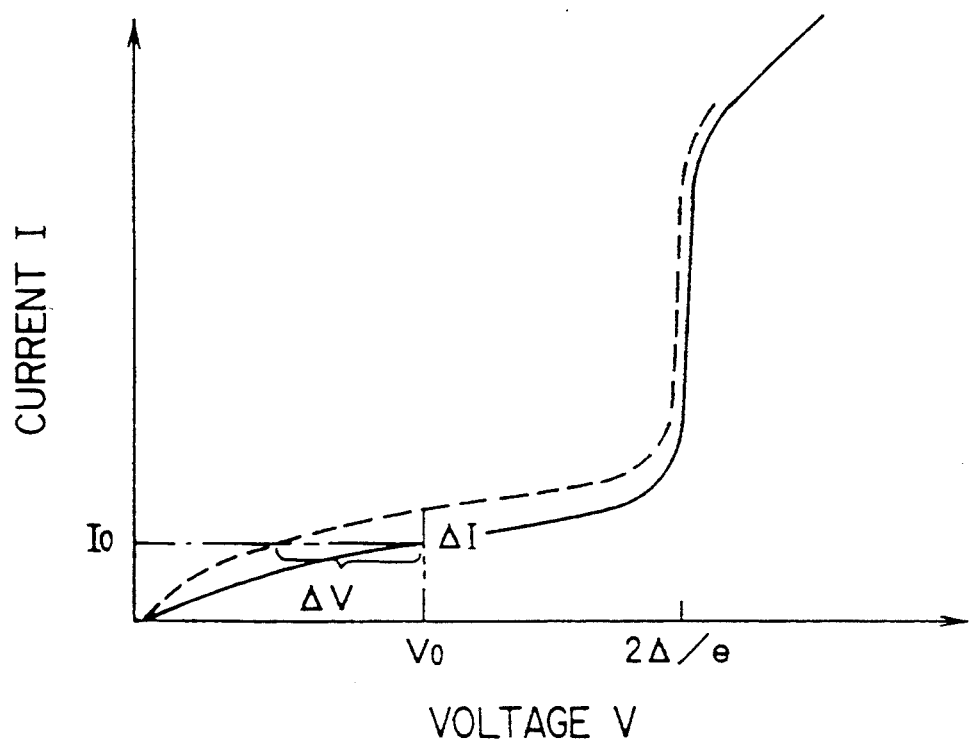
FIG. 25 is a graph of a current-voltage characteristic of the tunneling process of quasiparticles of the Josephson junction.

Then the wiring layers 22, 24 are formed on the Nb underlayer 56 in an about 600 nm-thickness. The Ta wiring layer 22 is connected to the Ta superconductor layer 14 through the contact hole, and the Ta wiring layer 24 is connected to the Ta superconductor layer 18 through the contact hole (FIG. 22C). And the radiation detecting device according to the sixth embodiment is completed.

The present invention is not limited to the above-described embodiments but covers modifications and variations.

For example, in the above-described embodiments, the barrier layers have two-layer structures of ZrOx—Zr or others, and three-layer structure of ZrOx—Zr, but may be formed of TaOx (tantalum oxide). When the barrier layer is formed of TaOx, the TaOx barrier layer can be formed by oxidizing the Ta superconductor layer as the lower electrode.

In the above-described embodiments, Ta substrates are used. But substrates of materials having large radiation stopping powers, such as, Hf, Pt or Au, may be used.

In the above-described embodiments, the SiO$_2$ layers are formed on the Ta substrates as the insulating layers. But the insulating layers may be formed of an oxide (TaOx). When the substrate is provided by a W substrate or Hf substrate other than a Ta substrate, the insulating layer may be formed of its oxide (WOx or HfOx).

What is claimed is:

1. A radiation detecting device comprising a substrate, a first superconductor layer formed on the substrate, a barrier layer formed on the first superconductor layer, and a second superconductor layer formed on the barrier layer, a junction formed of the first superconductor layer, the barrier layer and the second superconductor layer receiving radiation for detection thereof,
   the first superconductor layer being a Ta layer,
   the barrier layer including a TaOx layer, an AlOx layer, a HfOx layer or a ZrOx layer,
   a radiation stopping layer of a material having a large radiation stopping power being formed on the underside of the substrate, and
   an opening being formed in the substrate and the radiation stopping layer directly below the junction, radiation being incident to the junction through the opening.

2. A radiation detecting device according to claim 1, wherein
   the substrate is a silicon substrate.

3. A radiation detecting device according to claim 1, wherein
   the radiation stopping layer is a Ta layer, a W layer, a Hf layer a Pt layer or an Au layer.

4. A radiation detecting device according to claim 2, wherein
   the radiation stopping layer is a Ta layer, a W layer, a Hf layer a Pt layer or an Au layer.

5. A radiation detecting device according to claim 1, wherein
   a plurality of said junctions are arranged in an array on the substrate.

6. A radiation detecting device according to claim 1, wherein
   a underlayer of Nb, V, W, Hf, Zr or Ti having a lattice constant approximate to that of Ta is formed directly below the first superconductor layer.

7. A radiation detecting device according to claim 6, wherein
   the second superconductor layer is a Ta layer.

8. A radiation detecting device according to claim 7, wherein
   a underlayer of V, W or Ti having a lattice constant approximate to that of Ta is formed directly below the second superconductor layer.

9. A radiation detecting device according to claim 6, comprising
   wiring layer of Ta connected to the first superconductor layer or to the second superconductor layer; and
   a underlayer of Nb, V, W, Hf, Zr or Ti having a lattice constant approximate to that of Ta and formed directly below the wiring layer.

10. A radiation detecting device according to claim 7, comprising
    wiring layer of Ta connected to the first superconductor layer or to the second superconductor layer; and
    a underlayer of Nb, V, W, Hf, Zr or Ti having a lattice constant approximate to that of Ta and formed directly below the wiring layer.

11. A radiation detecting device according to claim 8, comprising
    wiring layer of Ta connected to the first superconductor layer or to the second superconductor layer; and
    a underlayer of Nb, V, W, Hf, Zr or Ti having a lattice constant approximate to that of Ta and formed directly below the wiring layer.

12. A radiation detecting device according to claim 6, wherein
    the barrier layer has a two-layer structure comprising a superconductor thin layer formed on the first superconductor layer, and an oxide thin layer on the superconductor thin layer formed by oxidizing the superconductor thin layer;
    the superconductor thin layer is a Zr layer, Hf layer or an Al layer; and
    the oxide thin layer is a ZrOx layer, a Hf Ox layer or an AlOx layer.

13. A radiation detecting device according to claim 6, wherein
    the barrier layer has a three-layer structure comprising a first superconductor thin layer formed on the first superconductor layer, an oxide thin layer on the first superconductor layer formed by oxidizing the first superconductor layer, and a second superconductor layer formed on the oxide thin layer;
    the first superconductor thin layer and the second superconductor thin layer are Zr layers, Hf layers or Al layers; and
    the oxide thin layer is a ZrOx layer, a HfOx layer or an AlOx layer.

14. A radiation detecting device comprising a substrate, a first superconductor layer formed on the substrate, a barrier layer formed on the first superconductor layer, and a second superconductor layer formed on the barrier layer, a junction formed of the first superconductor layer, the barrier layer and the second superconductor layer receiving radiation for detection thereof,
    the first superconductor layer being a Ta layer,
    the barrier layer including a TaOx layer, an AlOx layer, a HfOx layer or a ZrOx layer,
    the substrate being formed of a material having a large radiation stopping power, and
    an opening being formed in the substrate directly below the junction, the opening reaching the first superconductor layer and passing radiation from the underside of the substrate to the junction.

15. A radiation detecting device according to claim 14, wherein the material of a large radiation stopping power forming the substrate is Ta, W, Hf Pt or Au.

16. A radiation detecting device according to claim 14, wherein
an insulating layer is provided between the substrate and the first superconductor layer.

17. A radiation detecting device according to claim 15, wherein
an insulating layer is provided between the substrate and the first superconductor layer.

18. A radiation detecting device according to claim 16, wherein
the insulating layer is a layer of an oxide of the material of a large radiation stopping power forming the substrate.

19. A radiation detecting device according to claim 17, wherein
the insulating layer is a layer of an oxide of the material of a large radiation stopping power forming the substrate.

20. A radiation detecting device according to claim 14, wherein
a plurality of said junctions are arranged in an array on the substrate.

21. A radiation detecting device according to claim 14, wherein
a underlayer of Nb, V, W, Hf, Zr or Ti having a lattice constant approximate to that of Ta is formed directly below the first superconductor layer.

22. A radiation detecting device according to claim 21, wherein
the second superconductor layer is a Ta layer.

23. A radiation detecting device according to claim 22, wherein
a underlayer of V, W or Ti having a lattice constant approximate to that of Ta is formed directly below the second superconductor layer.

24. A radiation detecting device according to claim 21, comprising
wiring layer of Ta connected to the first superconductor layer or to the second superconductor layer; and
a underlayer of Nb, V, W, Hf, Zr or Ti having a lattice constant approximate to that of Ta and formed directly below the wiring layer.

25. A radiation detecting device according to claim 22, comprising
wiring layer of Ta connected to the first superconductor layer or to the second superconductor layer; and
a underlayer of Nb, V, W, Hf, Zr or Ti having a lattice constant approximate to that of Ta and formed directly below the wiring layer.

26. A radiation detecting device according to claim 23, comprising
wiring layer of Ta connected to the first superconductor layer or to the second superconductor layer; and
a underlayer of Nb, V, W, Hf, Zr or Ti having a lattice constant approximate to that of Ta and formed directly below the wiring layer.

27. A radiation detecting device according to claim 21, wherein
the barrier layer has a two-layer structure comprising a superconductor thin layer formed on the first superconductor layer, and an oxide thin layer on the superconductor thin layer formed by oxidizing the superconductor thin layer;
the superconductor thin layer is a Zr layer, Hf layer or an Al layer; and
the oxide thin layer is a ZrOx layer, a Hf Ox layer or an AlOx layer.

28. A radiation detecting device according to claim 21, wherein
the barrier layer has a three-layer structure comprising a first superconductor thin layer formed on the first superconductor layer, an oxide thin layer on the first superconductor layer formed by oxidizing the first superconductor layer, and a second superconductor layer formed on the oxide thin layer;
the first superconductor thin layer and the second superconductor thin layer are Zr layers, Hf layers or Al layers; and
the oxide thin layer is a ZrOx layer, a HfOx layer or an AlOx layer.

29. A method for fabricating a radiation detecting device comprising a substrate, a first superconductor layer formed on the substrate, a barrier layer formed on the first superconductor layer, and a second superconductor layer formed on the barrier layer, a junction formed of the first superconductor layer, the barrier layer and the second superconductor layer receiving radiation for detection thereof,
the method comprising the steps of:
forming on the substrate a underlayer of Nb, V, W, Hf, Zr or Ti; and
forming on the underlayer a first superconductor layer of Ta without heating the substrate.

30. A method for fabricating the radiation detecting device according to claim 29,
the method further comprising the steps of:
forming on the barrier layer a underlayer of V, W or Ti; and
forming on the underlayer a second superconductor layer of Ta without heating the substrate.

31. A method for fabricating the radiation detecting device according to claim 29,
the method further comprising the steps of:
forming an insulating layer on the first superconductor layer and on the second superconductor layer;
forming on the insulating layer a underlayer of Nb, V, W, Hf or Ti; and
forming on the underlayer a wiring layer of Ta to be connected to the first superconductor layer or to the second superconductor layer.

32. A method for fabricating the radiation detecting device according to claim 30,
the method further comprising the steps of:
forming an insulating layer on the first superconductor layer and on the second superconductor layer;
forming on the insulating layer a underlayer of Nb, V, W, Hf or Ti; and
forming on the underlayer a wiring layer of Ta to be connected to the first superconductor layer or to the second superconductor layer.

* * * * *

UNITED STATES PATENT AND TRADEMARK OFFICE
CERTIFICATE OF CORRECTION

PATENT NO. : 5,338,934

DATED : August 16, 1994

INVENTOR(S) : Shinichi MOROHASHI et al.

It is certified that error appears in the above-indentified patent and that said Letters Patent is hereby corrected as shown below:

On the title page, item:
 [30] Priority Data, delete "Japan 4-199126" and insert --Japan 191126 and also delete "Japan 4-280002" and insert --Japan 4-280002--.

Signed and Sealed this

Twenty-second Day of November, 1994

Attest:

BRUCE LEHMAN

Attesting Officer

Commissioner of Patents and Trademarks